(12) United States Patent
Choueiter et al.

(10) Patent No.: US 11,838,368 B2
(45) Date of Patent: *Dec. 5, 2023

(54) IDENTIFYING DEVICES CONNECTED TO A SMART CIRCUIT BREAKER

(71) Applicant: Sense Labs, Inc., Cambridge, MA (US)

(72) Inventors: Ghinwa Fakhri Choueiter, Somerville, MA (US); Jonah Wyman Petri, Somerville, MA (US)

(73) Assignee: Sense Labs, Inc., Cambridge, MA (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/121,035

(22) Filed: Mar. 14, 2023

(65) Prior Publication Data

US 2023/0224368 A1 Jul. 13, 2023

Related U.S. Application Data

(63) Continuation of application No. 17/509,960, filed on Oct. 25, 2021, now Pat. No. 11,637,901, which is a
(Continued)

(51) Int. Cl.
*H04L 67/125* (2022.01)
*G05B 19/042* (2006.01)
(Continued)

(52) U.S. Cl.
CPC .......... *H04L 67/125* (2013.01); *G01R 22/063* (2013.01); *G01R 22/10* (2013.01);
(Continued)

(58) Field of Classification Search
CPC ..... H04L 67/125; H04L 67/12; G01R 22/063; G01R 22/10; G05B 19/042; G05B 15/02;
(Continued)

(56) References Cited

U.S. PATENT DOCUMENTS

| 3,263,021 A | 7/1966 | Alan |
| D248,851 S | 8/1978 | Langlie et al. |

(Continued)

FOREIGN PATENT DOCUMENTS

| CA | 2802915 A1 | 12/2011 |
| CN | 101083586 A | 12/2007 |

(Continued)

OTHER PUBLICATIONS

"Chapter 8. Remote OS Detection", Nmap Network Scanning, https://nmap.org/book/osdetect.html (accessed Mar. 13, 2017), 6 pages.

(Continued)

*Primary Examiner* — Amine Benlagsir
(74) *Attorney, Agent, or Firm* — GTC Law Group PC & Affiliates

(57) ABSTRACT

A smart circuit breaker may provide a smart-circuit-breaker power monitoring signal that includes information about power consumption of devices connected to the smart circuit breaker. The smart-circuit-breaker power monitoring signal may be used in conjunction with power monitoring signals from the electrical mains of the building for providing information about the operation of devices in the building. For example, the power monitoring signals may be used to (i) determine the main of the house that provides power to the smart circuit breaker, (ii) identify devices receiving power from the smart circuit breaker, (iii) improve the accuracy of identifying device state changes, and (iv) train mathematical models for identifying devices and device state changes.

22 Claims, 12 Drawing Sheets

Related U.S. Application Data continuation of application No. 17/106,949, filed on Nov. 30, 2020, now Pat. No. 11,182,699, which is a continuation of application No. 16/179,567, filed on Nov. 2, 2018, now Pat. No. 10,878,343.

(60) Provisional application No. 62/740,201, filed on Oct. 2, 2018.

(51) Int. Cl.
| | |
|---|---|
| *G01R 22/10* | (2006.01) |
| *G01R 22/06* | (2006.01) |
| *G06N 20/00* | (2019.01) |
| *G06F 16/23* | (2019.01) |
| *G06F 1/28* | (2006.01) |
| *H04L 67/12* | (2022.01) |
| *H04Q 9/00* | (2006.01) |
| *H02J 13/00* | (2006.01) |

(52) U.S. Cl.
CPC ............. *G05B 19/042* (2013.01); *G06F 1/28* (2013.01); *G06F 16/2379* (2019.01); *G06N 20/00* (2019.01); *H02J 13/00036* (2020.01); *H04L 67/12* (2013.01); *H04Q 9/00* (2013.01); *H02J 13/00007* (2020.01); *H04Q 2209/84* (2013.01)

(58) Field of Classification Search
CPC .......... G06F 1/28; G06F 16/2379; G06F 1/30; G06N 20/00; G06N 3/044; G06N 7/01; G06N 3/088; G06N 5/01; G06N 20/10; G06N 3/084; G06N 5/046; G06N 20/20; H02J 13/00036; H02J 13/00007; H04Q 9/00; H04Q 2209/84; Y02E 60/00; Y04S 10/18; Y04S 40/121; Y04S 40/18
See application file for complete search history.

(56) References Cited

U.S. PATENT DOCUMENTS

| | | |
|---|---|---|
| 4,316,142 A | 2/1982 | Kuramoto |
| D274,614 S | 7/1984 | Fallon et al. |
| D313,791 S | 1/1991 | Matsui |
| 5,162,772 A | 11/1992 | May |
| 5,652,507 A | 7/1997 | Blakely |
| 5,945,993 A | 8/1999 | Fleischmann |
| 6,311,105 B1 | 10/2001 | Budike |
| 7,085,814 B1 | 8/2006 | Gandhi et al. |
| D534,120 S | 12/2006 | Ricci et al. |
| D550,619 S | 9/2007 | Ricci et al. |
| 7,353,182 B1* | 4/2008 | Missinhoun ....... G06Q 10/0631 705/7.33 |
| D610,541 S | 2/2010 | Mueller et al. |
| 7,884,598 B2 | 2/2011 | Wang et al. |
| 8,239,073 B2* | 8/2012 | Fausak ................ G01D 4/002 700/286 |
| 8,674,823 B1 | 3/2014 | Contario et al. |
| 8,760,151 B2 | 6/2014 | McBee et al. |
| 8,913,629 B2 | 12/2014 | Yonge et al. |
| 8,930,152 B2 | 1/2015 | Patel et al. |
| 9,057,746 B1 | 6/2015 | Houlette et al. |
| 9,152,737 B1 | 10/2015 | Micali et al. |
| 9,172,623 B1 | 10/2015 | Micali et al. |
| 9,355,000 B1 | 5/2016 | Biswas et al. |
| 9,429,599 B1 | 8/2016 | Contario et al. |
| 9,443,195 B2 | 9/2016 | Micali et al. |
| 9,634,853 B2 | 4/2017 | Jones et al. |
| 9,691,030 B2 | 6/2017 | Micali et al. |
| 9,699,529 B1 | 7/2017 | Petri et al. |
| 9,735,588 B2 | 8/2017 | Gilbert et al. |
| 9,739,813 B2 | 8/2017 | Houlette et al. |
| 9,800,958 B1* | 10/2017 | Petri ..................... H04Q 9/00 |
| 9,942,630 B1 | 4/2018 | Petri et al. |
| 9,958,925 B2 | 5/2018 | Chapel et al. |
| 10,001,792 B1* | 6/2018 | Packer .................. G06Q 50/06 |
| 10,175,276 B2* | 1/2019 | Fishburn ............. G01R 21/133 |
| 10,338,112 B2* | 7/2019 | Micali ................. G01R 21/133 |
| D873,126 S | 1/2020 | Tang |
| 10,586,177 B1 | 3/2020 | Choueiter et al. |
| 10,735,829 B2 | 8/2020 | Petri et al. |
| 10,740,691 B2 | 8/2020 | Choueiter et al. |
| 10,750,252 B2 | 8/2020 | Petri et al. |
| 10,809,286 B2 | 10/2020 | Micali et al. |
| 10,878,343 B2 | 12/2020 | Choueiter et al. |
| 11,146,868 B2 | 10/2021 | Petri et al. |
| 11,182,699 B2 | 11/2021 | Choueiter et al. |
| D944,731 S | 3/2022 | Weinstein et al. |
| 11,503,386 B2 | 11/2022 | Petri et al. |
| 11,536,747 B2 | 12/2022 | Weinstein et al. |
| 11,556,857 B2 | 1/2023 | Choueiter et al. |
| 11,556,858 B2 | 1/2023 | Choueiter et al. |
| 11,582,309 B2 | 2/2023 | Choueiter et al. |
| 11,582,310 B2 | 2/2023 | Choueiter et al. |
| 11,588,896 B2 | 2/2023 | Choueiter et al. |
| 11,616,845 B2 | 3/2023 | Choueiter et al. |
| 11,627,188 B2 | 4/2023 | Choueiter et al. |
| 11,637,901 B2 | 4/2023 | Choueiter et al. |
| 2002/0178047 A1* | 11/2002 | Or ........................... G06Q 30/04 705/412 |
| 2003/0216971 A1 | 11/2003 | Sick et al. |
| 2004/0142662 A1 | 7/2004 | Ehrenberg et al. |
| 2004/0255171 A1 | 12/2004 | Zimmer et al. |
| 2005/0034023 A1 | 2/2005 | Maturana et al. |
| 2005/0085973 A1 | 4/2005 | Furem et al. |
| 2005/0108582 A1 | 5/2005 | Fung et al. |
| 2006/0155514 A1 | 7/2006 | Drouart et al. |
| 2006/0235574 A1 | 10/2006 | Lapinski et al. |
| 2008/0306985 A1 | 12/2008 | Murray et al. |
| 2009/0058399 A1 | 3/2009 | Wang et al. |
| 2009/0222360 A1 | 9/2009 | Schmitt et al. |
| 2010/0211222 A1 | 8/2010 | Ghosn et al. |
| 2010/0217550 A1 | 8/2010 | Crabtree et al. |
| 2010/0332373 A1 | 12/2010 | Crabtree et al. |
| 2011/0066300 A1 | 3/2011 | Tyagi et al. |
| 2011/0196547 A1 | 8/2011 | Park et al. |
| 2011/0245987 A1* | 10/2011 | Pratt ...................... G05B 15/02 320/132 |
| 2012/0022713 A1 | 1/2012 | Deaver et al. |
| 2012/0065802 A1 | 3/2012 | Seeber et al. |
| 2012/0092060 A1 | 4/2012 | Ganesan |
| 2012/0181869 A1 | 7/2012 | Chapel et al. |
| 2012/0197448 A1 | 8/2012 | Shin et al. |
| 2012/0197560 A1 | 8/2012 | Kuhns et al. |
| 2012/0221718 A1 | 8/2012 | Imes et al. |
| 2012/0239773 A1 | 9/2012 | Blustein et al. |
| 2012/0278272 A1 | 11/2012 | Kim et al. |
| 2012/0280833 A1 | 11/2012 | Jonsson et al. |
| 2012/0290230 A1 | 11/2012 | Berges Gonzalez et al. |
| 2012/0290239 A1 | 11/2012 | Ku et al. |
| 2012/0319675 A1 | 12/2012 | El-essawy et al. |
| 2013/0066479 A1 | 3/2013 | Shetty et al. |
| 2013/0076343 A1 | 3/2013 | Carpenter et al. |
| 2013/0132009 A1 | 5/2013 | Rolia et al. |
| 2013/0183043 A1 | 7/2013 | Elberbaum |
| 2013/0241746 A1* | 9/2013 | McKinley .............. G01R 29/18 340/870.02 |
| 2013/0262197 A1* | 10/2013 | Kaulgud ................. H02J 3/001 705/14.1 |
| 2013/0268357 A1 | 10/2013 | Heath et al. |
| 2014/0052304 A1 | 2/2014 | Vuppala et al. |
| 2014/0188565 A1* | 7/2014 | Dantressangle ... G06Q 30/0201 705/7.29 |
| 2014/0192677 A1 | 7/2014 | Chew et al. |
| 2014/0207255 A1 | 7/2014 | Tandon et al. |
| 2014/0214729 A1 | 7/2014 | Lin et al. |
| 2014/0266784 A1* | 9/2014 | Ratcliff ................... G01D 4/004 340/870.03 |
| 2014/0278241 A1 | 9/2014 | Jiang et al. |
| 2014/0303796 A1 | 10/2014 | Jeong et al. |
| 2015/0012147 A1 | 1/2015 | Haghighat-Kashani et al. |
| 2015/0094968 A1 | 4/2015 | Jia et al. |

(56) References Cited

U.S. PATENT DOCUMENTS

| | | |
|---|---|---|
| 2015/0102800 A1 | 4/2015 | Deokar et al. |
| 2015/0112906 A1 | 4/2015 | Gauthier et al. |
| 2015/0127185 A1 | 5/2015 | Behrangrad |
| 2015/0142695 A1 | 5/2015 | He et al. |
| 2015/0149128 A1 | 5/2015 | Baone et al. |
| 2015/0161020 A1 | 6/2015 | Matsuoka et al. |
| 2015/0204558 A1 | 7/2015 | Sartain et al. |
| 2015/0244121 A1 | 8/2015 | Amelio et al. |
| 2015/0261944 A1 | 9/2015 | Hosom et al. |
| 2015/0271557 A1 | 9/2015 | Tabe |
| 2015/0271575 A1 | 9/2015 | Asao et al. |
| 2015/0324696 A1 | 11/2015 | Hirschbold et al. |
| 2016/0093297 A1 | 3/2016 | Deisher et al. |
| 2016/0132772 A1 | 5/2016 | Little |
| 2016/0139575 A1 | 5/2016 | Funes |
| 2016/0146866 A1 | 5/2016 | Houlette et al. |
| 2016/0147243 A1 | 5/2016 | Micali et al. |
| 2016/0148099 A1 | 5/2016 | Micali et al. |
| 2016/0195864 A1* | 7/2016 | Kim .......... H04L 41/0886 709/221 |
| 2016/0313744 A1 | 10/2016 | Amelio et al. |
| 2016/0328651 A1 | 11/2016 | Micali et al. |
| 2016/0336745 A1 | 11/2016 | Pandya et al. |
| 2016/0369777 A1 | 12/2016 | Chiang et al. |
| 2017/0045560 A1 | 2/2017 | Rice |
| 2017/0082992 A1 | 3/2017 | Riley et al. |
| 2017/0086143 A1 | 3/2017 | Pike et al. |
| 2017/0134182 A1 | 5/2017 | Davis et al. |
| 2017/0176502 A1 | 6/2017 | Saneyoshi et al. |
| 2017/0176503 A1 | 6/2017 | Saneyoshi et al. |
| 2017/0192042 A1 | 7/2017 | Micali et al. |
| 2018/0196094 A1 | 7/2018 | Fishburn et al. |
| 2018/0238933 A1 | 8/2018 | Lachman et al. |
| 2018/0242056 A1 | 8/2018 | Petri et al. |
| 2018/0269634 A1 | 9/2018 | Tompkins |
| 2018/0343507 A1 | 11/2018 | Petri et al. |
| 2019/0346484 A1 | 11/2019 | Worones |
| 2020/0011901 A1 | 1/2020 | Lin |
| 2020/0075235 A1 | 3/2020 | Montenegro et al. |
| 2020/0104756 A1 | 4/2020 | Choueiter et al. |
| 2020/0107085 A1 | 4/2020 | Choueiter et al. |
| 2020/0107086 A1 | 4/2020 | Choueiter et al. |
| 2020/0212667 A1 | 7/2020 | Marin Perez et al. |
| 2020/0329287 A1 | 10/2020 | Petri et al. |
| 2020/0400729 A1 | 12/2020 | Micali et al. |
| 2021/0011056 A1 | 1/2021 | Weinstein |
| 2021/0011057 A1 | 1/2021 | Watlington |
| 2021/0048459 A1 | 2/2021 | Micali et al. |
| 2021/0081845 A1 | 3/2021 | Choueiter et al. |
| 2021/0293863 A1 | 9/2021 | Micali et al. |
| 2021/0293864 A1 | 9/2021 | Micali et al. |
| 2021/0392417 A1 | 12/2021 | Petri et al. |
| 2022/0044154 A1 | 2/2022 | Choueiter et al. |
| 2022/0044155 A1 | 2/2022 | Choueiter et al. |
| 2022/0044156 A1 | 2/2022 | Choueiter et al. |
| 2022/0044157 A1 | 2/2022 | Choueiter et al. |
| 2022/0044158 A1 | 2/2022 | Choueiter et al. |
| 2022/0044159 A1 | 2/2022 | Choueiter et al. |
| 2022/0044160 A1 | 2/2022 | Choueiter et al. |
| 2022/0044161 A1 | 2/2022 | Choueiter et al. |
| 2023/0016529 A1 | 1/2023 | Petri et al. |
| 2023/0017026 A1 | 1/2023 | Petri et al. |
| 2023/0019666 A1 | 1/2023 | Petri et al. |

FOREIGN PATENT DOCUMENTS

| | | |
|---|---|---|
| CN | 101241367 A | 8/2008 |
| CN | 102098323 A | 6/2011 |
| CN | 102314547 A | 1/2012 |
| CN | 102549521 A | 7/2012 |
| CN | 102822639 A | 12/2012 |
| CN | 104885406 A | 9/2015 |
| CN | 104897978 A | 9/2015 |
| CN | 105119882 A | 12/2015 |
| DE | 202018002755 U1 | 8/2018 |
| EP | 2570775 A1 | 3/2013 |
| EP | 3370070 A1 | 9/2018 |
| JP | 2010213411 A | 9/2010 |
| JP | 2012016270 A | 1/2012 |
| JP | 2014072561 A | 4/2014 |
| JP | 2014086995 A | 5/2014 |
| JP | 2015060453 A | 3/2015 |
| JP | 2015136254 A | 7/2015 |
| KR | 1020100111170 A | 10/2010 |
| KR | 101448683 B1 | 10/2014 |
| WO | 2011002735 A1 | 1/2011 |
| WO | 2011029137 A2 | 3/2011 |
| WO | 2012106709 A2 | 8/2012 |
| WO | 2013022035 A1 | 2/2013 |
| WO | 2013106923 A1 | 7/2013 |
| WO | 2013179671 A1 | 12/2013 |
| WO | 2015073997 A2 | 5/2015 |
| WO | 2016081510 A1 | 5/2016 |
| WO | 2016085500 A1 | 6/2016 |
| WO | 2016085942 A1 | 6/2016 |
| WO | 2018156546 A1 | 8/2018 |
| WO | 2020072490 A1 | 4/2020 |

OTHER PUBLICATIONS

"DC Electric Power", http://hyperphysics.phy-astr.gsu.edu/hbase/electric/elepow.html, (accessed on Aug. 5, 2016), 1 Page.

"Host Discovery, Chapter 15. Nmap Reference Guide", Nmap Network Scanning, https://nmap.org/book/man-host-discovery.html (accessed Mar. 13, 2017), 9 pages.

"Simple Service Discovery Protocol", Wikipedia, https://en.wikipedia.org/wiki/Simple_Service_Discovery_Protocol (accessed on Mar. 13, 2017), 3 pages.

14906856.1, "European Application Serial No. 14906856.1, Extended European Search Report dated Mar. 16, 2018", Sense Labs, Inc.

15863620.9, "European Application Serial No. 15863620.9, Extended European Search Report dated Oct. 17, 2018", Sense Labs, Inc.

18756635.1, "European Application Serial No. 18756635.1, Extended European Search Report dated Nov. 17, 2020", Sense Labs, Inc.

19206642.1, "European Application Serial No. 19206642.1, Extended European Search Report dated Feb. 26, 2020", Sense Labs, Inc.

2019351894, "Australian Application Serial No. 2019351894, Examination Report dated Apr. 20, 2021", Sense Labs, Inc.

2202632.2, "United Kingdom Application Serial No. 2202632.2, Search Report dated Mar. 30, 2022", Sense Labs, Inc.

22168888.0, "European Application Serial No. 22168888.0, Extended European Search Report dated Jul. 28, 2022", Sense Labs, Inc.

Aliexpress, "Current Sensor Clamp Current Sensor", Link: https://www.aliexpress.com/item/4000269161232.html?ws_ab_test=searchweb0_0,searchweb201602_0,searchweb201603_0,ppcSwitch_0&algo_pvid=5c669c1e-d376-4a8e-893a-db216e298d26&algo_expid=5c669c1e-d376-4a8e-893a-db216e298d26-22. Visited Sep. 13, 2020., 2020, 12 pages.

Alles, Hal, et al., "A Commercial Disaggregation System for Residential and Light Commercial Buildings", Presented on Jun. 3, 2014 at the NILM Workshop 2014, University of Texas at Austin, http://nilmworkshop14.files.wordpress.com/2014/05/alles_commercial.pdf, accessed on Dec. 22, 2014, 4 pages.

Anderson, Kyle, et al., "Unsupervised Approximate Power Trace Decomposition Algorithm", Presented on Jun. 3, 2014 at the NILM Workshop 2014, University of Texas at Austin, http://nilmworkshop14.files.wordpress.com/2014/05/anderson_unsupervised.pdf, accessed on Dec. 22, 2014, 4 pages.

Anonymous, "Nonintrusive load monitoring—Wikipedia",, 3 pages.

Anonymous, "Smart meter", Wikipedia, Retrieved from the Internet: URL:https://en.wikipedia.org/w/index.php?title=Smart_meter&oldid=634667241 [retrieved on Oct. 8, 2019], 2014, 18 pages.

Armel, K. Carrie, et al., "Is Disaggregation the Holy Grail of Energy Efficiency? The Case of Electricity", Precourt Energy Efficiency Center Technical Paper Series: PTP-2012-05-1, Stanford University, http://web.stanford.edu/group/peec/cgi-bin/docs/behavior/

(56) References Cited

OTHER PUBLICATIONS research/disaggregation-armel.pdf accpt./publ. in: Energy Policy, 2013, vol. 52, issue C, pp. 213-234 , May 1, 2012 , 50 pages.

Barker, Sean , et al. , "NILM Redux: The Case for Emphasizing Applications over Accuracy", Presented on Jun. 3, 2014 at the NILM Workshop 2014, University of Texas at Austin, http://nilmworkshop14.files.wordpress.com/2014/05/barker_nilm.pdf , accessed on Dec. 22, 2014 , 4 pages.

Barsim, Karim Said, et al. , "An Approach for Unsupervised Non-Intrusive Load Monitoring of Residential Appliances" , Presented on Jun. 3, 2014 at the NILM Workshop 2014, University of Texas at Austin, http://nilmworkshop14.files.wordpress.com/2014/05/barsim_approach.pdf , accessed on Dec. 22, 2014 , 5 pages.

Batra, Nipun , et al. , "NILMTK: An Open Source Toolkit for Non-intrusive Load Monitoring" , Presented on Jun. 3, 2014 at the NILM Workshop 2014, University of Texas at Austin, http://nilmworkshop14.files.wordpress.com/2014/05/batra_nilmtk.pdf , accessed on Dec. 22, 2014 , 4 pages.

Bilski, Piotr , et al. , "Analysis of the artificial intelligence methods applicability to the non-intrusive load monitoring" , Presented on Jun. 3, 2014 at the NILM Workshop 2014, University of Texas at Austin, http://nilmworkshop14.files.wordpress.com/2014/05/bilski_analysis.pdf , accessed on Dec. 22, 2014 , 4 pages.

Brown, Richard , et al. , "Using Wireless Power Meters to Measure Energy Use of Miscellaneous and Electronic Devices in Buildings" , Proceedings of the Energy Efficiency in Domestic Appliances and Lighting (EEDAL) 20001 Conference, Copenhagen, Denmark , 14 Pages.

Cheshire, S. , et al. , "Multicast DNS" , Internet Engineering Task Force (IETF), Request for Comments: 6762, Category: Standards Track, ISSN: 2070-1721, Apple, Inc., https://tools.ietf.org/html/rfc6762 (accessed Mar. 13, 2017) , 140 pages.

Cheshire, Stuart , "Zero Configuration Networking (Zeroconf)" , http://www.zeroconf.org/ (accessed Mar. 13, 2017) , 4 pages.

Dewesoft , "High-accuracy Current Sensors and Transducers" , Link: https://dewesoft.com/products/interfaces-and-sensors/current-clamps-and-transducers. Visited Sep. 13, 2020. , 2020 , 17 pages.

Dong, Roy , et al. , "Energy Disaggregation via Adaptive Filtering" , Presented on Jun. 3, 2014 at the NILM Workshop 2014, University of Texas at Austin, http://nilmworkshop14.files.wordpress.com/2014/05/dong_energy.pdf , accessed on Dec. 22, 2014 , 4 pages.

Figueiredo, Marisa , et al. , "On the Optimization of Appliance Loads Inferred by Probabilistic Models" , Presented on Jun. 3, 2014 at the NILM Workshop 2014, University of Texas at Austin, http://nilmworkshop14.files.wordpress.com/2014/05/figueiredo_optimization.pdf , accessed on Dec. 22, 2014 , 4 pages.

Froehlich, Jon , et al. , "Disaggregated End-Use Energy Sensing for the Smart Grid", Pervasive Computing, IEEE, vol. 10, iss. 1 , pp. 28-39.

Goland, Yaron Y., et al., "Simple Service Discovery Protocol/1.0, Operating without an Arbiter, <draft-cai-ssdp-v1-03.txt>" , Internet Engineering Task Force, Internet Draft, Microsoft Corporation, Shivaun Albright, Hewlett-Packard Company, https://tools.ietf.org/html/draft-cai-ssdp-v1-03, (accessed on Mar. 13, 2017) , Oct. 28, 1999, 36 pages.

Holmegaard, Emil , et al. , "Towards Automatic Identification of Activity Modes in Electricity Consumption Data for Small and Medium Sized Enterprises" , Presented on Jun. 3, 2014 at the NILM Workshop 2014, University of Texas at Austin, http://nilmworkshop14.files.wordpress.com/2014/05/holmegaard_towards.pdf , accessed on Dec. 22, 2014 , 4 pages.

Jacquemod, Cyril , et al. , "Innovating current sensor for NILM application" , Presented on Jun. 3, 2014 at the NILM Workshop 2014, University of Texas at Austin, http://nilmworkshop14.files.wordpress.com/2014/05/jacquemod_innovating.pdf , accessed Dec. 22, 2014 , 4 pages.

Jazizadeh, Farrokh , et al. , "An unsupervised hierarchical clustering based heuristic algorithm for facilitated training of electricity consumption disaggregation systems" , Advanced Engineering Informatics 28.4 , pp. 311-326.

Kelly, Jack , et al. , "Metadata for Energy Disaggregation" , Presented on Jun. 3, 2014 at the NILM Workshop 2014, University of Texas at Austin, http://nilmworkshop14.files.wordpress.com/2014/05/kelly_metadata.pdf , accessed on Dec. 22, 2014 , 4 pages.

Li, Yeqing , et al. , "Energy Disaggregation via Hierarchical Factorial HMM" , Presented on Jun. 3, 2014 at the NILM Workshop 2014, University of Texas at Austin, http://nilmworkshop14.files.wordpress.com/2014/05/li_energy.pdf , accessed on Dec. 22, 2014 , 4 pages.

Liao, Jing , et al. , "Power Disaggregation for Low-sampling Rate Data" , Presented on Jun. 3, 2014 at the NILM Workshop 2014, University of Texas at Austin, http://nilmworkshop14.files.wordpress.com/2014/05/liao_power.pdf , accessed on Dec. 22, 2014 , 4 pages.

Maasoumy, M. , et al. , "Handling model uncertainty in model predictive control for energy efficient buildings" , Energy and Building, vol. 77 , pp. 377-392.

Makonin, Stephen , et al. , "Efficient Sparse Matrix Processing for Nonintrusive Load Monitoring (NILM)" , Presented on Jun. 3, 2014 at the NILM Workshop 2014, University of Texas at Austin, http://nilmworkshop14.files.wordpress.com/2014/05/makonin_efficient.pdf , accessed on Dec. 22, 2014 , 4 pages.

Makonin, Stephen , et al. , "The cognitive power meter: Looking beyond the smart meter" , 2013 26th IEEE Canadian Conference on Electrical and Computer Engineering (CCECE). IEEE, pp. 1-5.

PCT/US18/18897 , "International Application Serial No. PCT/US18/18897, International Preliminary Report on Patentability dated Sep. 6, 2019" , Sense Labs, Inc.

PCT/US18/18897 , "International Application Serial No. PCT/US18/18897, International Search Report and Written Opinion dated Mar. 16, 2018" , Sense Labs, Inc.

PCT/US19/54062 , "International Application Serial No. PCT/US19/54062, International Preliminary Report on Patentability dated Apr. 15, 2021" , Sense Labs, Inc.

PCT/US19/54062 , "International Application Serial No. PCT/US19/54062, International Search Report and Written Opinion dated Jan. 2, 2020", Sense Labs, Inc.

PCT/US2014/067662 , "International Application Serial No. PCT/US2014/067662, International Preliminary Report on Patentability and Written Opinion dated Jun. 8, 2017" , Sense Labs, Inc.

PCT/US2014/067662 , "International Application Serial No. PCT/US2014/067662, International Search Report and Written Opinion dated Aug. 12, 2015" , Sense Labs, Inc.

PCT/US2015/062346 , "International Application Serial No. PCT/US2015/062346 International Search Report and Written Opinion dated Feb. 29, 2016" , Sense Labs, Inc.

PCT/US2015/062346 , "International Application Serial No. PCT/US2015/062346, International Preliminary Report on Patentability and Written Opinion dated Jun. 8, 2017" , Sense Labs, Inc.

Perez, Krystian X, et al. , "Nonintrusive Disaggregation of Residential Air-Conditioning Loads from Sub-hourly Smart Meter Data" , Presented on Jun. 3, 2014 at the NILM Workshop 2014, University of Texas at Austin, http://nilmworkshop14.files.wordpress.com/2014/05/perez_nonintrusive1.pdf, accessed on Dec. 22, 2014 , 4 pages.

Phillips, Dennis E, et al. , "Supero: A sensor system for unsupervised residential power usage monitoring" , 2013 IEEE International Conference on Pervasive Computing and Communications (PerCom). IEEE , 2013 , pp. 66-75.

Tang, Guoming , et al., "Semi-Intrusive Load Monitoring for Large-Scale Appliances", Presented on Jun. 3, 2014 at the NILM Workshop 2014, University of Texas at Austin, http://nilmworkshop14.files.wordpress.com/2014/05/tang_semiintrusive.pdf , accessed on Dec. 22, 2014 , 4 pages.

Trung, Kien Nguyen, et al. , "Event Detection and Disaggregation Algorithms for NIALM System" , Presented on Jun. 3, 2014 at the NILM Workshop 2014, University of Texas at Austin, http://nilmworkshop14.files.wordpress.com/2014/05/trung_event.pdf , accessed on Dec. 22, 2014 , 4 pages.

Tyler, Chris , et al. , "Direct, Instantanious Identification of Home Appliances" , Presented on Jun. 3, 2014 at the NILM Workshop 2014, University of Texas at Austin, http://nilmworkshop14.files.wordpress.com/2014/05/tyler_direct.pdf , accessed on Dec. 22, 2014 , 4 pages.

(56) References Cited

OTHER PUBLICATIONS

Zalewski, Michal , "p0f v3 (version 3.09b)" , http://lcamtuf.coredump.cx/p0f3/ (accessed on Mar. 13, 2017) , 4 pages.
Zeifman, Michael , "Disaggregation of home energy display data using probabilistic approach" , IEEE Transactions on Consumer Electronics 58.1 , pp. 23-31.

\* cited by examiner

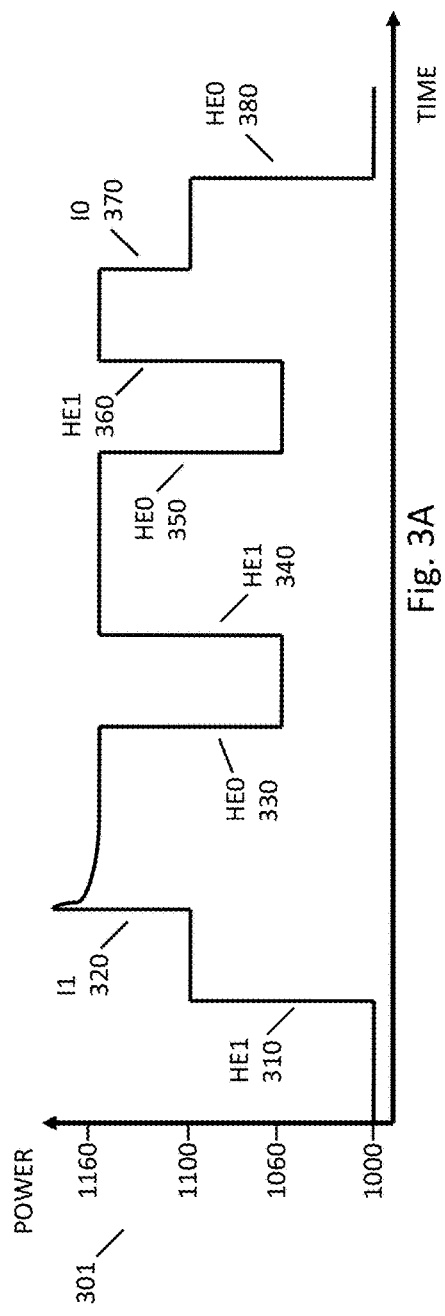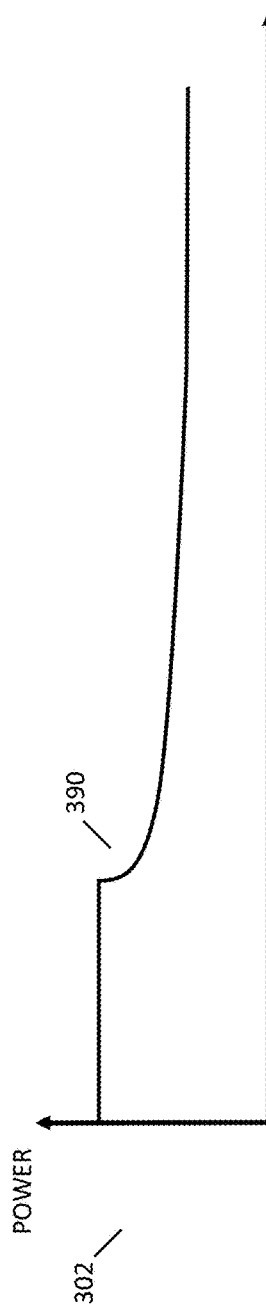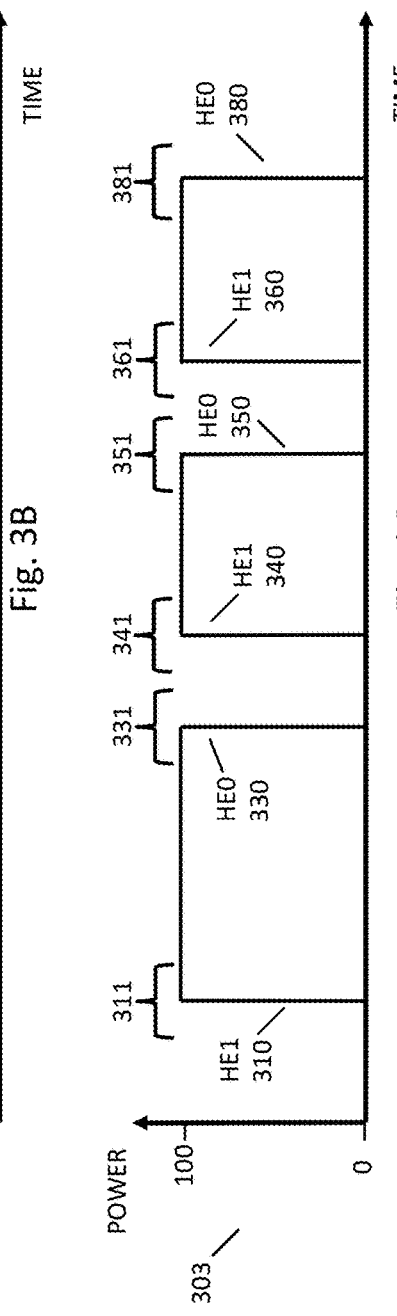

| ID | Name | Type | Make | Version | Power Model | Network Address | Network Model | Main | Smart Plug | State |
|---|---|---|---|---|---|---|---|---|---|---|
| 1001 | Oven | Oven | Kenmore | 1000 | Oven | None | None | Both | No | On |
| 1002 | Kitchen Plug | Smart Plug | Wemo | A | Plug-826 | 192.168.0.1 | Plug-285 | Second | No | Off |
| 1003 | Toaster | Toaster | Breville | 101 | Toaster-101 | 192.168.0.2 | None | Second | 1002 | Off |
| 1004 | John's Mac | Computer | Mac | X | Mac-396 | 192.168.0.3 | Mac-710 | Either | No | Sleep |
| ... | | | | | | | | | | |

IDENTIFYING DEVICES CONNECTED TO A SMART CIRCUIT BREAKER

CROSS-REFERENCE TO RELATED APPLICATIONS

This application is a continuation of U.S. patent application Ser. No. 17/509,960, filed Oct. 25, 2021, and titled "ELECTRICAL PANEL FOR IDENTIFYING DEVICES CONNECTED TO A SMART PLUG".

U.S. patent application Ser. No. 17/509,960 is a continuation of U.S. patent application Ser. No. 17/106,949, filed Nov. 30, 2020, and titled "DETERMINING DEVICE STATE CHANGES USING SMART PLUGS", now issued on Nov. 23, 2021, as U.S. Pat. No. 11,182,699.

U.S. patent application Ser. No. 17/106,949 is a continuation of U.S. patent application Ser. No. 16/179,567, filed Nov. 2, 2018, and titled "DETERMINING A POWER MAIN OF A SMART PLUG", now issued on Dec. 29, 2020, as U.S. Pat. No. 10,878,343.

U.S. patent application Ser. No. 16/179,567 claims the benefit of priority to U.S. Provisional Patent Application Ser. No. 62/740,201, filed Oct. 2, 2018, and titled "POWER MONITORING USING SMART PLUGS".

Each of the foregoing applications is incorporated herein by reference in its entirety.

BACKGROUND

Reducing electricity or power usage provides the benefits, among others, of saving money by lowering payments to electric companies and also protecting the environment by reducing the amount of resources needed to generate the electricity. Electricity users, such as consumers, businesses, and other entities, may thus desire to reduce their electrical usage to achieve these benefits. Users may be able to more effectively reduce their electricity usage if they have information about what devices (e.g., refrigerator, oven, dishwasher, furnace, and light bulbs) in their homes and buildings are using the most electricity and what actions are available to reduce electricity usage.

A power monitor can be installed at an electrical panel to obtain information about electricity used by many devices in a building. A power monitor on an electrical panel is convenient because a single monitor can provide aggregate usage information about many devices. It is more difficult, however, to extract more specific information about usage of power by a single device, since the monitor typically measures signals that reflect the collective operation of many devices, which may overlap in complex ways. The process of obtaining information about the power usage of a single device from an electrical signal corresponding to usage by many devices may be referred to as disaggregation.

Power monitors for individual devices are also available for measuring the power usage of a single device. For example, a device can be plugged into a smart plug, and the smart plug can in turn be plugged into a wall outlet. These smart plugs can provide information about power usage for the devices they provide power to, but it may not be practical to monitor all or even many devices in a house or building with these smart plugs, because it may require a large number of smart plugs that may be expensive and require significant manual effort to install.

To provide the greatest benefits to end users, a need exists for more accurate disaggregation techniques, so that end users receive accurate information about the electrical usage of individual devices.

BRIEF DESCRIPTION OF THE FIGURES

The invention and the following detailed description of certain embodiments thereof may be understood by reference to the following figures:

FIGS. 3A-C are examples of power monitoring signals from mains and a smart plug.

DETAILED DESCRIPTION

Figure 1:
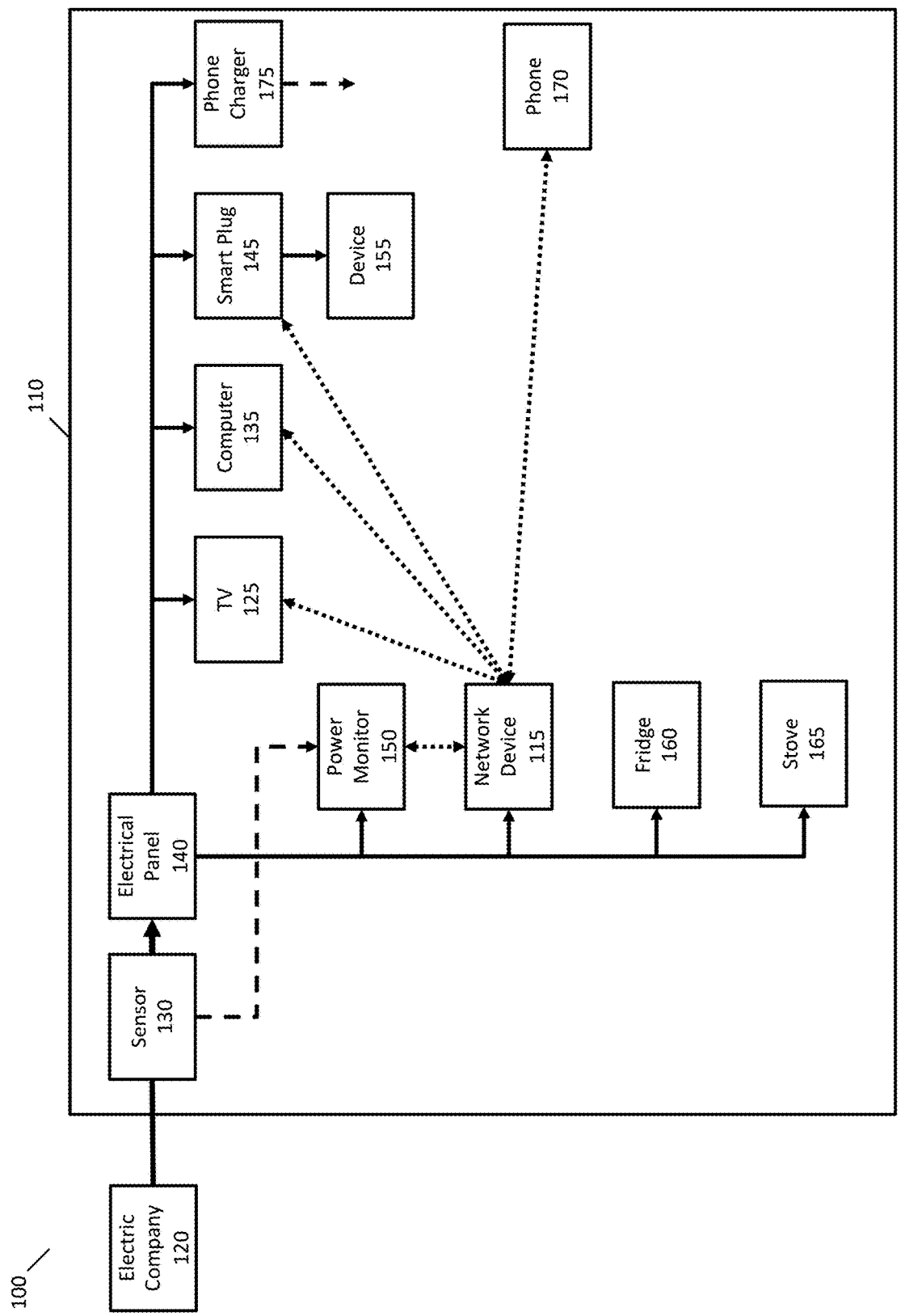
FIG. 1 is an example system for identifying devices and state changes of devices using power monitoring and network monitoring.

Described herein are techniques for identifying devices and determining information about state changes of devices in a building. One source of data in determining information about devices in a building is the electrical line that provides power to the devices in the building. Electrical sensors may be placed on the electrical line (or lines) that are providing power to the building, and disaggregation techniques may be used to determine information about individual devices in the building. For example, any of the techniques described in U.S. Pat. No. 9,443,195, which is hereby incorporated by reference in its entirety for all purposes, may be used to determine information about devices using electrical measurements.

Another source of data for identifying devices or determining information about device state changes in a building is a computer network in the building. A building may have a network, such as a local area network, and devices may connect to the network via a wire (e.g., an Ethernet cable) or wirelessly (e.g., Wi-Fi). A building may have multiple networks, such as local area network coordinated by a wireless router, a mesh network created by other devices working in cooperation (e.g., Sonos speakers), or a personal area network (e.g., a Bluetooth connection between devices). For example, any of the techniques described in U.S. Pat. No. 9,699,529, which is hereby incorporated by reference in its entirety for all purposes, may be used to determine information about devices using network data.

Some devices may be powered by the electrical line in the building but may not have a network connection (e.g., a conventional refrigerator). Some devices may be powered by the electrical line in the building and have a network connection (e.g., a "smart" refrigerator). Some devices may have a network connection but may not by powered by the electrical line (e.g., mobile devices, such as smartphones) or may only sometimes be powered by the electrical line (e.g., when charging). The techniques described herein may provide more information and/or more accurate information about devices in the building by using a combination of information from the electrical line and information from a network in the building.

The information from the electrical line and from the network in the building may be used to provide a service to users to inform them about the status of devices in the building. A company may provide a power monitoring device (or power monitor) that may be installed in the building and connected to both the power line and the computer network of the building. The power monitoring device may use both the electrical line and network data to determine information about what devices are present in the building and also the states of the devices (e.g., on or off). This information may then be made available to a user, such as by presenting it in a specialized application or app (e.g., on a smartphone) or a web page. The service may provide the user with information about devices in the building, such as real-time information about the states of devices, real-time power usage by devices, and historical information about device activity.

A building may also include devices known as "smart plugs." A smart plug may provide information about power consumption for devices that receive power from the smart plug. A smart plug, for example, may plug into a conventional electrical outlet and allow a device to be plugged into the smart plug. Accordingly, the device receives power via the smart plug. A smart plug can include functionality to provide information about the power provided to the device connected to the smart plug. For example, the smart plug may include one or more sensors that measure electrical properties (e.g., current, voltage, or power) of the electricity provided to the device connected to the smart plug. The sensor data may be used to determine an amount of power consumed by the device over time. The smart plug may also have a network connection (e.g., Wi-Fi or Bluetooth) to transmit information about the power usage of the connected device to other devices, such as a smart phone. A smart plug may have other functionality as well. For example, a smart plug may have an electrical relay to start and stop the flow of electricity to a device connected to the smart plug, and a user may have an app on a smart phone that allows a user to control the relay.

A power monitor may receive information from a smart plug to improve the services provided by the power monitor. For example, a power monitor may have a network connection with a smart plug and receive information from the smart plug about the amount of power provided by the smart plug to devices connected to the smart plug.

For clarity of presentation, the techniques described herein will use a house or home as an example of a building where the techniques may be applied, but the techniques described herein are equally applicable to any environment where electricity is used, including but not limited to businesses and commercial buildings, government buildings, and other venues. References to homes throughout should be understood to encompass such other venues.

Power Monitor Environment

FIG. 1 is an example of a system 100 where power monitoring and network monitoring may be used to determine information about devices in a home. In FIG. 1, electric company 120 provides electrical power to house 110. The electrical power is transmitted to an electrical panel 140 where it may then be distributed to different electrical circuits in the house.

Electrical panel 140 may be any electrical panel that may be found in a building. For example, electrical panel 140 may implement split-phase electric power, where a 240 volt AC electrical signal is converted with a split-phase transformer to a three-wire distribution with a single ground and two mains (or phases or legs) that each provide 120 volts. Some devices in the house may use one of the two mains to obtain 120 volts; other devices in the house may use the other main to obtain 120 volts; and yet other devices may use both mains simultaneously to obtain 240 volts.

Any type of electrical panel may be used, and the techniques described herein are not limited to a split phase electrical panel. For example, electrical panel 140 may be single phase, two phase, or three phase. The techniques are also not limited to the number of mains provided by electrical panel 140. In the discussion below, electrical panel 140 will be described as having two mains, but any number of mains may be used, including just a single main. Other voltage standards, such as for other countries or continents, are intended to be encompassed herein as would be understood by one of ordinary skill in the art.

FIG. 1 illustrates devices that are consuming electricity provided by electrical panel 140. For example, power monitor 150, refrigerator 160, and stove 165 may consume electricity provided via electrical panel 140.

Power monitor 150 may be connected to sensor 130 to measure electrical properties of the electrical line connected to house 110. For example, sensor 130 may measure voltage and/or current levels for electrical lines providing electricity to electrical panel 140. The measurements may be obtained using any available sensors, and the techniques are not limited to any particular sensors or any particular types of values that may be obtained from sensors. Sensor 130 may comprise multiple sensors, such as one or more sensors for each main.

Sensor 130 may provide one or more power monitoring signals to power monitor 150, such as a measurement of current and/or voltage for each main connected to electrical panel 140. Power monitor 150 may process the power monitoring signals to disaggregate them or to obtain information about individual devices in the home. For example, power monitor 150 may determine state changes of devices, such as the television was turned on at 8:30 pm or the compressor of the refrigerator started at 10:35 am and 11:01 am.

Power monitor 150 may be a device that is obtained separately from electrical panel 140 and installed by a user or electrician to connect to electrical panel 140. Power monitor 150 may be part of electrical panel 140 and installed by the manufacturer of electrical panel 140. Power monitor 150 may also be part of (e.g., integrated with or into) an electrical meter, such as one provided by the electric company, and sometimes referred to as a smart meter.

Power monitor 150 may use any appropriate techniques for performing disaggregation or determining information about the power usage or state of individual devices from the power monitoring signal. For example, power monitor 150 may use any of the techniques described in U.S. Pat. No. 9,443,195.

Power monitor 150 may be connected to a computer network in the house. For example, power monitor 150 may have a wired connection to a router in the house (e.g., LAN Ethernet), may have a wireless connection to a network (e.g., Wi-Fi), or may have direct network connections with other devices (e.g., Bluetooth). In these implementations, power monitor 150 is also a network monitor, but for clarity of presentation, the following description will continue to use the term power monitor.

FIG. 1 illustrates network connections between the power monitor and other devices in the house. In this example, power monitor 150 has a network connection with network device 115, which may be any device that facilitates a network in the house, such as a modem, router, or hub. Other devices in the house may also be connected to network device 115. For example, a television 125 (e.g., a smart television), computer 135 (e.g., a personal computer), smart plug 145 (e.g., a Phillips Hue or Belkin Wemo switch), and a phone 170 (e.g., an Android phone or iPhone) may also be connected to the home network. Power monitor 150 may connect to other devices in the house using any appropriate wired or wireless network configuration, such as LAN Ethernet or direct connections with other devices. In some implementations, power monitor 150 may communicate on multiple networks simultaneously (e.g., a Wi-Fi connection to a home router and a Bluetooth connection to a specific device).

Figure 2:
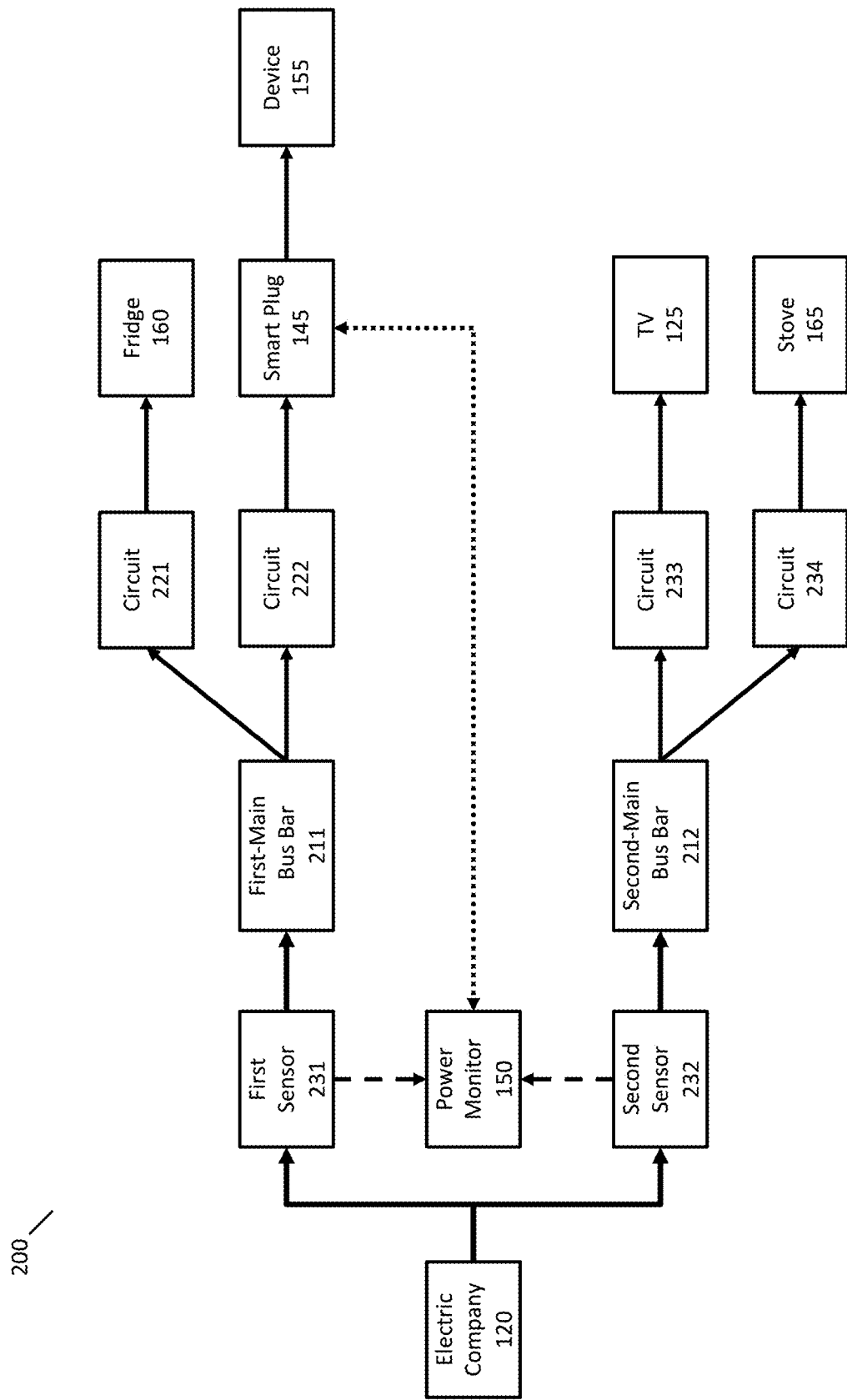
FIG. 2 is an example system for power monitoring and network monitoring illustrating electrical mains and circuits.

FIG. 2 is an example of a system 200 illustrating two mains and four circuits of a house, such as the house of system 100. The techniques described herein, however, apply to any number of mains and circuits.

In FIG. 2, electric company 120 is providing two electrical mains of power, for example a first electrical main that is 180 degrees out of phase with a second electrical main. Power monitor 150 may have a first sensor 231 that measures an electrical property of the first-main to obtain a first-main power monitoring signal, and a second sensor 232 that measures an electrical property of the second-main to obtain a second-main power monitoring signal.

The two mains of electrical power may be distributed to devices in the house over multiple electrical circuits. For example, first-main bus bar 211 may distribute first-main electrical power to circuit 221 and circuit 222, and second-main bus bar 212 may distribute second-main electrical power to circuit 233 and circuit 234. Various devices may receive power from the electrical circuits as shown in FIG. 2. Note that multiple devices may receive power from a single circuit, and that some devices may receive power using both the first-main and the second-main, but these configurations are not presented in FIG. 2 for clarity of presentation.

Power monitor 150 may have a network connection with smart plug 145 and receive a smart-plug power monitoring signal from smart plug 145 that provides information about the power consumption of one or more devices connected to smart plug 145, such as device 155. Accordingly, power monitor may receive information about the power consumption of device 155 from two sources: (1) a first-main power monitoring signal obtained via first sensor 231 and (2) a smart-plug power monitoring signal obtained from smart plug 145.

FIGS. 3A-3C illustrate an example of a hypothetical first-main power monitoring signal 301, second-main power monitoring signal 302, and smart-plug power monitoring signal 303 that may be processed by power monitor 150.

In FIG. 3A, first-main power monitoring signal 301 illustrates power events caused by state changes of two devices, a toaster oven and an incandescent light bulb. Both the toaster oven and the incandescent light bulb receive power from the first electrical main of the building. In FIG. 3A, the power events labelled with HE1 correspond to a heating element of the toaster oven being turned on and the power events labelled with HE0 correspond to the heating element of the stove being turned off (for toaster ovens, the heating element may appear to be on to the user, but the toaster oven may cause the heating element to turn on and off on a periodic basis to maintain a desired temperature). The power event labelled with I1 corresponds to an incandescent light bulb being turned on and the power event labelled I0 corresponds to the incandescent light bulb being turned off.

At power event 310, the toaster oven is turned on and the heating element consumes electricity. Accordingly, the power usage increases in the first-main power monitoring signal 301. While the heating element is on, at power event 320, the incandescent light bulb is turned on to further increase the power usage. At power events 330, 340, 350, and 360, the heating element is turned off, then on, then off, and then on again. At power event 370, the incandescent light bulb is turned off, and at power event 380, the toaster oven is turned off and the heating element stops consuming electricity.

In FIG. 3B, second-main power monitoring signal 302 illustrates a power event 390 caused by a state change of a device that receives power from the second electrical main of the building. For example, power event 390 may correspond to charging an electric car. Because the devices changing states in FIGS. 3A and 3B each receive power from a single electrical main, the power events caused by the state changes of the devices appear in only one of FIG. 3A or FIG. 3B. For a device that receives power from both electrical mains (e.g., an electric dryer), power events caused by state changes of the device may appear in both FIGS. 3A and 3B.

FIG. 3C is a smart-plug power monitoring signal 303 received from a smart plug that is connected to the toaster oven of FIG. 3A. Accordingly, for each state change of the toaster oven, a power event appears both in first-main power monitoring signal 301 and smart-plug power monitoring signal 303.

Although the power events caused by the toaster oven appear in both power monitoring signals (first-main and smart plug), the power events may appear differently in the two power monitoring signals. For example, the two power monitoring signals may measure different electrical properties (e.g., current vs. voltage), may use different types of physical sensors that produce different readings, may be shifted or translated in time (e.g., due to network transmission or other delays), may be scaled differently (e.g., because of different sensor gains), or may be digitally sampled at different sampling rates. For example, for some smart plugs, a low sampling rate may cause the power events 330, 340, 350, and 360 to not appear in smart-plug power monitoring signal 303, and smart-plug power monitoring signal may have a relatively constant value between power event 310 and power event 380.

Power Monitoring

Power monitor 150 may process first-main power monitoring signal 301 and second-main power monitoring signal 302 (either may be referred to as a power monitoring signal) to identify devices and/or determine state changes of devices. Some state changes may correspond to a person turning on or off the device and some state changes may correspond to a change in the functioning of a device (e.g., cycling of a heating element or washing machine changing from wash mode to a spin mode). Power monitor 150 may use any appropriate techniques for identifying devices and determining state changes of devices from a power monitoring signal, such as any of the techniques described in U.S. Pat. No. 9,443,195.

In some implementations, power monitor 150 may process a power monitoring signal with mathematical models to identify devices and determine state changes of devices. Such models will be referred to as power models. For example, power monitor 150 may have power models for different types of devices (e.g., stove, dishwasher, refrigerator, etc.), different makes of devices (e.g., Kenmore dishwasher, Maytag dishwasher, etc.), different versions of devices (e.g., Kenmore 1000 dishwasher), and specific devices (e.g., the dishwasher at 100 Main St.). Power monitor 150 may also have power models for particular state changes, such as a device turning on, a device turning off, or a device changing operation in another way (a water pump of a dishwasher turning on or off). In common usage, the "1000" in a Kenmore 1000 dishwasher may be referred to as a "model" of the dishwasher, but to avoid confusion with mathematical models, the "model" of a dishwasher will instead be referred to herein as a "version."

When processing the power monitoring signal with a power model, such as any of the power models referred to above, the power model may generate a score (e.g., a probability, likelihood, confidence, etc.) indicating a match between the power model and the power monitoring signal. When a power event occurs in the power monitoring signal (such as any of the events in FIGS. 3A-C), a portion of the power monitoring signal that includes the power event may be processed by a variety of power models, and a score may be generated by each of the power models. The power model scores may be used to identify devices in the home and/or determine state changes of devices in the home.

In some implementations, power monitoring may proceed as follows. The power monitoring signal may be continuously processed to identify power events in the power monitoring signal. A power event detection component may detect changes in the electrical signal that likely correspond to device state changes and cause these portions of the power monitoring signal to be further processed. A power event detection component may be implemented using any appropriate techniques, such as a classifier.

After a power event is detected, a feature generation component may be used to generate features from the portion of the power monitoring signal that includes the power event. Any appropriate features may be computed, such as any of the features described in U.S. Pat. No. 9,443,195.

The features may then be processed by one or more power models to identify a device or determine a device state change corresponding to the power event. Any appropriate power models may be used, such as the transition models, device models (also referred to herein a state models), wattage models, and prior models described in U.S. Pat. No. 9,443,195. For example, each power model may generate a score, and the device state change may be determined by selecting the power model with the highest score.

Techniques for identifying devices in a home using power models are now described. In some implementations, power monitor 150 may be installed with an initial set of power models corresponding to devices that are likely in the house.

In some implementations, power monitor 150 may identify a device as being in the house if a score generated by a power model exceeds a threshold. For example, a dishwasher model may generate a score that exceeds a threshold when a dishwasher model processes a portion of the power monitoring signal corresponding to the dishwasher being started. The threshold may be specific to the dishwasher model or the threshold may be the same for all power models. In some implementations, a confidence level may be computed in addition to or instead of the score, and a device will be identified when the confidence level exceeds a threshold.

In some implementations, additional criteria may be considered before identifying a device. For example, power monitor 150 may have multiple dishwasher power models corresponding to different types of dishwashers (e.g., regular dishwashers and energy efficient dishwashers) or there may be power models for different makes of dishwashers. When processing the power monitoring signal corresponding to the dishwasher starting, multiple dishwasher models may produce a score (or confidence level) that exceeds the threshold. Instead of identifying multiple dishwashers, a single dishwasher may be identified corresponding to the highest scoring model that exceeds the threshold. For example, power monitor 150 may have a power model for Kenmore dishwashers and Bosch dishwashers. Each model may generate a score that exceeds the threshold, but the score of the Kenmore model may be higher than the score for the Bosch model. Accordingly, a Kenmore dishwasher may be identified.

In some implementations, power monitor 150 may be updated with additional power models after a device has been identified. For example, after it has been determined that the house has a dishwasher, power models may be added to power monitor 150 corresponding to the most common makes of dishwashers. The power monitoring signal may then be processed with the power models for different makes of dishwashers, and a highest scoring power model may be used to identify the make of the dishwasher in the house. This process may be repeated to determine additional information, such as a version of the dishwasher (e.g., Kenmore 1000 dishwasher).

After devices in the house have been identified, power monitor 150 may process the power monitoring signal to determine state changes of the identified devices. In addition to having power models for particular devices, power monitor 150 may also have models for particular state changes of devices, and these models may be used to determine when a device changes state.

As described above, power models for state changes of devices may be used to process a power monitoring signal to generate scores for the possible state changes. Where a score (or confidence level) exceeds a threshold, power monitor 150 may determine that the state change corresponding to the model has occurred. For example, power monitor 150 may have power models for the dishwasher starting operation and finishing operation. When the power model for the dishwasher starting generates a score that exceeds a threshold, power monitor 150 may determine that the dishwasher has started. Similarly, when the power model for the dishwasher ending generates a score that exceeds a threshold, power monitor 150 may determine that the dishwasher has finished its cycle.

The power models for determining state changes need not be the same as the power models for identifying devices, and the thresholds used for determining state changes need not be the same as the thresholds used for identifying devices. The models and thresholds may be adjusted to obtain desired tradeoffs for accuracy and error rates.

Aspects of the operations described above for identifying devices and determining state changes of devices may be performed by other computers instead of power monitor 150 (e.g., a server computer operating in conjunction with a power monitor). For example, in some implementations, power monitor 150 may provide a power monitoring signal to another computer (e.g., a server) and the other computer may identify devices and state changes. In some implementations, the other computer may identify devices, and power monitor 150 may determine state changes of devices.

Network Monitoring

In some implementations, power monitor 150 may be connected to a computer network in the house. For example, power monitor 150 may have a wired connection to a router in the house (e.g., LAN Ethernet), may have a wireless connection to a network (e.g., Wi-Fi), or may have direct network connections with other devices (e.g., Bluetooth). In these implementations, power monitor 150 is also a network monitor, but for clarity of presentation, the following description will continue to use the term power monitor. Power monitor 150 may use any appropriate techniques for identifying devices and determining state changes of devices from network data, such as any of the techniques described in U.S. Pat. No. 9,699,529.

Power monitor 150 may learn about devices in the house using data transmitted over the computer network. For example, power monitor 150 may listen for broadcast messages from other devices, may poll other devices, or may listen for network data generated by other devices. In some implementations, power monitor 150 may learn about other devices in the house indirectly via networks outside of the house. For example, a device in the house may transmit information to a third-party server that operates in conjunction with that device, and the third-party server may transmit information to a server that operates in conjunction with power monitor 150. Each of these techniques may be used to identify devices in the house and determine state changes of the devices (e.g., that the device is on or off).

In some implementations, a device in the house may transmit data that includes information about the device itself (e.g., a broadcast message or response to poll). For example, a network transmission may include any of the following: a state (e.g., device just turned on or will be turning off), services offered by the device, a user assigned name (e.g., "John's Mac"), a make, a hardware version, a software version, a network address (e.g., an IP address), an identification number (e.g., a MAC address, a device serial number, a universally unique identifier, a globally unique identifier, or a temporary identifier), or other information (e.g., protocol-specific identification (such as a Zeroconf service name) or a resource locator used with the SSDP protocol).

Power monitor 150 may learn information about another device by listening for broadcast messages from the other device (a broadcasting device). Some devices may be configured to broadcast information across a network to announce services or capabilities offered by the device to other devices on the network. For example, a television may provide a service to allow other devices (e.g., phones or personal computers) to stream video content to the television for the television to display, and the television may broadcast a message to the network so that other devices know that this service is available.

Information from the broadcast messages may be used to identify devices in the house. For example, the messages may include data that may be used to identify the device, such as text describing the device or an identifier. Information from the broadcast messages may also be used to determine the state of the device. For example, announcing the availability of a service may indicate that the device is on and announcing withdrawal of a service may indicate that the device is off. In some implementations, a broadcast message may provide some information about the device, and upon receiving the broadcast message, power monitor 150, may poll the device to obtain additional information about the state of the device. For example, a network speaker system may broadcast that services are available, and power monitor 150 may then poll the network speaker system to find out that it is currently playing music and information about the music being played (e.g., song title, volume, etc.)

Power monitor 150 may learn information about another device using polling techniques. Any appropriate polling techniques may be used to poll a device. In some implementations, the broadcasting techniques described above may also allow for polling. For example, SSDP may allow a device to poll other devices on the network to determine what services those devices provide, and those devices may respond with messages similar to the broadcast messages described above. In some implementations, lower-level protocol polling may be used, such as internet control message protocol (ICMP) pings or address resolution protocol (ARP) pings.

Information from poll responses may be used to identify devices in the house. For example, poll responses may include data that may be used to identify the device, such as text describing the device or an identifier. Poll responses may also be used to determine the state of the device. For example, a lack of a response to a poll request may indicate that the device is off, a response may indicate that the device is on, and information in the response may provide additional information (e.g., a song that is being played).

Power monitor 150 may learn information about another device by monitoring network data sent by the device to other devices. In some implementations, individual device monitoring may only be used with an explicit opt in by a user or may use only a network packet header (and not the packet body) to avoid collecting too much information or avoid collecting sensitive information. Power monitor 150 may passively receive this network data on the network, such as by passively receiving network packets.

Power monitor 150 may process the received data to determine information about the monitored device. Information in the received data may be used to identify the device, such as text describing the device or an identifier. The received data may also be used to determine the state of the device. For example, the fact that the device is transmitting data indicates that the device is on, and if the device does not transmit any data over a period of time, it may be determined that the device is off.

In some implementations, power monitor 150 may have information about publicly available APIs for third-party devices and use these APIs to determine whether such third-party devices are present in the house. For example, power monitor 150 may periodically send out a request using the Nest thermostat API to determine if a Nest thermostat is present in the house. After it is determined that a Nest thermostat is in the house, it may be polled more frequently to determine the state of the Nest thermostat or the state of the heating/cooling system. The APIs may allow, for example, other devices to determine the temperature of the house, a desired temperature set by a user, or a state of the heating system or cooling system (e.g., whether the furnace is currently active or start and stop times of furnace activity). Querying a device with a specialized API may allow power monitor 150 to determine the state of the device itself (e.g., the Nest thermostat) and other devices that are connected to it (e.g., the furnace).

In some implementations, power monitor 150 may subscribe to notifications transmitted by third-party devices, which are referred to herein as notifying devices. A notifying device may be configured to transmit notifications to other devices (e.g., periodically or upon a state change) and allow other devices to sign up to receive the notifications using an API. Power monitor 150 may determine that a notifying device is in the house and then subscribe to receive notifications from the device. Power monitor 150 may transmit requests to receive notifications from notifying devices without knowing that the notifying devices are present, and where the notifying devices are present, be subscribed to receive notifications. Some notifying devices may have a pairing procedure that requires assistance of a user, and power monitor 150 may be configured to receive input from a user to assist with the pairing process, such as receiving a user name and password to pair with the notifying device.

Other third-party devices may also provide information about devices they are connected to or that they control, such as a smart switch or a smart light bulb (e.g., Phillips Hue or Belkin Wemo). A smart switch may have an API to allow other devices to interact with it, and power monitor 150 may use this API to determine a state of the switch, and accordingly whether the device connected to the smart switch is consuming power (e.g., the device is on, the device is off, or a dimmer-type switch is at 40%). Other examples include a smart thermostat that controls a heating or cooling system and may transmit network packets including information about the state of the heating or cooling system; a device that controls lights (e.g., LED lights) and may transmit network packets including information about the state of the lights; a device that controls speakers and may transmit network packets including information about the state of the speakers; a network connected plug that controls the flow of power to the device connected to the plug and may transmit network packets including information about whether the flow of power is enabled to the connected device or not; or a car charger that charges an electric car and may transmit network packets including information about the amount of power being consumed by the car.

In some implementations, power monitor 150 may receive information about a device in the house via a server external to the house, such as a third-party server that operates in conjunction with a third-party device in the house. Power monitor 150 may operate in conjunction with a power monitor server, and the third-party device in the house may operate in conjunction with the third-party server. For example, a Nest thermostat may send information about the state of the thermostat or the heating/cooling system of the house to a server operated by Nest. The third-party server may allow a user to provide configuration information to cause the third-party server to transmit information to the power monitor server using, for an example, an API of the power monitor server or the third-party server. For example, the Nest server may transmit information received from the Nest thermostat in the house to the power monitor server, such as on a periodic basis or when a state of the thermostat changes (or the state of the heating/cooling system changes). In some implementations, the power monitor server may send requests to the third-party server for information about the third-party device instead of receiving notifications from the third-party server. In some implementations, the third-party device may communicate directly with the power monitor server, or power monitor 150 may communicate directly with the third-party server.

In some implementations, information received in a network transmission from a device may be used to obtain further information about the device. For example, network transmissions may include a unique identifier, such as a media access control (MAC) address. A unique identifier may be used to determine additional information about the device using a data store or repository of information about devices that use the unique identifier. A data store may provide information about the type, make and/or version of the device based on the unique identifier. For example, for MAC addresses, blocks of continuous MAC addresses may be specific to a type of device (e.g., television), manufacturer, or a version of the device (e.g., a particular model of a television). In some implementations, a data store of MAC address information may be available, such as through a third-party service, and information about the device may be obtained using the MAC address. A data store of identifiers may be created, purchased, or accessed (e.g., using a third-party server) to obtain information about the device from the identifier.

In some implementations, user devices, such as a smartphone, may be used to determine information about devices in the house, and the smart phone may relay this information to power monitor 150. For example, a speaker (e.g., a portable Bluetooth speaker) may not have a network connection with network device 115 and may instead use another network, such as a Bluetooth network, to communicate with other devices. The speaker may be too far from power monitor 150 such that power monitor may not be able to detect the network of the speaker. A user device, such as phone 170, may be brought into the same room as the speaker, and phone 170 may be able to determine that the speaker is present and/or an operating state of the speaker using a direct network connection. Phone 170 may then relay information about the presence and/or operating state of the speaker to power monitor 150 or to a server that works in conjunction with power monitor 150.

In some implementations, network models may be used to identify devices or determine states of devices by processing network data. A network model may include any appropriate mathematical models, such as classifiers, neural networks, self-organizing maps, support vector machines, decision trees, random forests, logistic regression, Bayesian models, linear and nonlinear regression, and Gaussian mixture models. A network model may receive as input data obtained from network transmissions and output identifications of devices or device state changes with an optional score. For example, a network model could receive a broadcast message, information about poll responses received from the device (or lack thereof), or information about network data generated by that device. In some implementations, the network model may receive only headers of network transmissions or may receive all data from the network transmissions.

In some implementations, a network model may be used to identify a device or determine a state of a device using messages broadcast by the device. For example, a device may transmit a certain number and/or type of messages before it turns off and a different number and/or type of messages when going into a sleep mode. A first network model may be created for describing expected messages when a device is about to turn off and a second network model may be created for describing expected messages when a device is about to go into sleep mode. When receiving broadcast messages from the device, the messages may be processed with both network models to generate a score for each network model, and the state transition may be determined by the highest scoring network model.

Network models may also be created to describe other aspects of the network transmissions described above. For example, network models may be created to describe how often a device responds to a poll request and an expected time delay between transmitting the poll request and receiving the response. In another example, a network model may be created that describes expected network transmissions of a device in a particular state, and this network model may be applied when passively monitoring network transmissions of a device.

In some implementations, a rules-based approach may be used to identify devices in the house or determine the states of devices. Power monitor 150 (or a server operating in conjunction with the power monitor) may have rules that have been created for identifying types of devices, makes of devices, or versions of device; rules for determining state changes of devices; and rules for determining other aspects of devices. Rules may be created for any of the techniques described above, such as processing broadcast messages from a device, polling a device, or monitoring network data generated by a device.

Some rules may output a boolean value to indicate whether the conditions of the rule are met or not. For example, a rule may be created to determine whether the device that transmitted the network data is a television, and if the conditions of the rule are satisfied, it is determined that the device is a television. Some rules may output a score, for example, on a scale of 1 to 100, to indicate a match between the network data and the rule. For example, a rule may be created to determine whether the device that transmitted the network data is a television, and a score produced by the rule may be used to make the determination, such as by comparing the score to a threshold or combining the score with other scores as described herein.

Multiple rules may exist for making a determination. For example, multiple rules may exist for determining whether the device that transmitted the network data is a television, and if any one of the rules is satisfied, it may be determined that the device is a television.

Any data in a network transmission or data relating to a network transmission may be used as input into a rule. For example, information extracted from a network transmission (such as a network address, an identifier, a header, a string) may be used as input into a rule. Information that is not in the network transmission but is related to the network transmission may also be used, such as a time that the network transmission was received.

In some implementations, a rule may comprise one or more conditions that need to be satisfied for the rule to be met. For example, a condition may include any comparison of data, such as inequality, equality, greater than or less than. Rules may employ any combinations of conditions, including but not limited to combinations using Boolean algebra. Examples of rules include the following: a device that broadcasts Zeroconf services including AFP, HTTP, and SSH is an Apple Mac OS computer; structured data returned as part of a NetBIOS STATUS poll request provides a user-visible name of a host; a device with a previously-unseen MAC address making a DHCP request is a new device joining the network for the first time; and the vendor of a device is determined using known MAC address vendor prefixes.

In some implementations, device fingerprinting techniques may be used to identify devices on the network. Device fingerprints may be created for known devices, such as a Mac computers, Windows computers, and Linux computers, and possibly different operating system versions of each. A fingerprint may be created by sending multiple requests to each device using, for example, different protocols and port numbers (e.g., using a program such as Nmap). The responses of each device may be recorded to create a fingerprint for each device. Any appropriate data may be used when creating device fingerprints, such as the number and types of network protocols broadcast by the device, broadcast behavior, number or frequency of different types of broadcasts, or parameters used for network transmissions (e.g., a TCP window size).

For an unknown device in the house, similar requests may be sent to that device and the responses may be used to create a fingerprint for the unknown device. The fingerprint for the unknown device may be compared with the fingerprints for known devices to determine information about the unknown device. For example, if the fingerprint of the unknown device has a closest match with the fingerprint for a Mac laptop, then the unknown device may be identified as a Mac laptop. In some implementations, address resolution protocol (ARP) may be used to identify devices on the network and then each of the identified devices may be fingerprinted using the techniques described above.

Any of the techniques described above for identifying devices or determining device states using network data may generate a score indicating a match between the data and the identified device or state change. For example, applying a rule to a broadcast message may result in a determination that the device is a Toshiba television with a score of 80% or a Sony television with a score of 60%. The scores generated by network models may be combined with scores generated by power models as described in greater detail below.

Combined Power and Network Monitoring

Figures 4, 5:
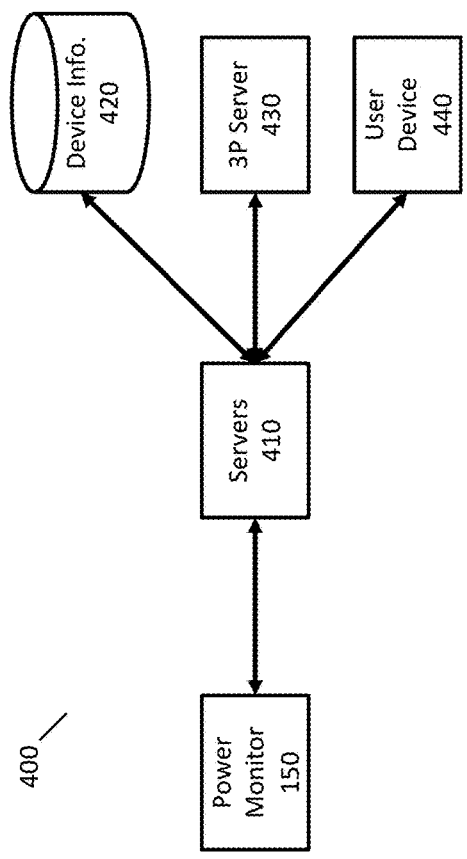
FIG. 4 is an example of a system for a service for power monitoring and network monitoring.
FIG. 5 is an example list of devices.

FIG. 4 illustrates a system 400 for providing users with information about devices in their home using one or both of power monitoring and network monitoring. In FIG. 4, power monitor 150 may have any of the functionality described above. For example, power monitor 150, may identify the existence of devices in the house, may determine states of devices in the house, and may determine power consumption of devices in the house. Power monitor 150 may transmit the information about devices in the home to servers 410 using any known networking techniques. For example, power monitor may have a wireless connection to a router, which in turn connects to servers 410.

Servers 410 may process the information received from power monitor 150 and present information to users, such as through user device 440. Servers 410 may maintain a device list for devices in the home and update the device list with newly identified devices or updated states of devices. Servers 410 may further record a log of device state changes, record a history of power consumption of the house and individual devices, and perform any of the other operations described in U.S. Pat. No. 9,443,195. For performing some operations, servers 410 may access other resources, such as third-party servers 430 and a device information data store 420.

A user may obtain information about devices in the house using user device 440. User device 440 may be any device that provides information to a user including but not limited to phones, tablets, desktop computers, and wearable devices. User device 440 may present, for example, information about device state changes and real-time power usage to the user. For example, user device 440 may present a web page to the user or a special-purpose app may be installed on user device 440. The information presented by user device 440 may include any of the information described in U.S. Pat. No. 9,443,195.

To provide information to users about devices in a home, a list of devices in the home may be maintained. FIG. 5 illustrates an example device list 500. The list of devices may include any information relating to devices in the home, including but not limited to a device ID (which may be particular to the home or all devices known by a company providing the service), a name (e.g., a user supplied name), a type, a make, a version, one or more power models that are used to identify state changes of the device, a network ID (e.g., a network address or other identifier, such as a MAC address), one or more network models that are used to identify state changes of the device, the main that provides power to the device (e.g., first, second, both, or either (e.g., for portable devices that may be plugged in to different electrical outlets)), an identifier of a smart plug that the device is connected to (or an indicator that the device is not connected to a smart plug), and a state of the device.

Device list 500 may be stored in one or more locations. For example, device list 500 may be stored at one or more of power monitor 150, servers 410, device information data store 420, or user device 440. Different versions of the device list may be stored in different locations corresponding to the processing at the location. For example, power monitor 150 may not store the name, type, make, or version of the devices because this information may not be needed to determine device state changes. User device 440 may not store information about power models and network models because user device 440 may not determine any device state changes.

In FIG. 1, power monitor 150 may process one or more power monitoring signals and network data to identify devices in the home and to identify state changes of devices in the home. Power monitor 150 may receive one or more power monitoring signals from sensor 130 that measures an electrical property of power provided to house 110. Power monitor 150 is also connected to the network in house 110 via network device 115. Power monitor 150 may receive network data from other devices via network device 115 (as indicated by the dotted lines) or may receive network data directly from other devices (not shown in FIG. 1).

For some devices in the home, either one or both of power monitoring and network monitoring may be inaccurate or have higher error rates than desired when identifying devices or state changes of devices. By using both power monitoring and network monitoring cooperatively or simultaneously, the performance of identifying devices or state changes of devices may be improved. Simultaneous power monitoring and network monitoring may be implemented using any appropriate techniques, as described in greater detail below, such as combining scores, rules, or voting techniques.

In some implementations, the operations of power monitor 150 may change depending on whether a user is interacting with user device 440 to view information about devices in the house. Where a user is viewing information about devices in the home using user device 440, it may be desired to identify new devices or state changes of devices more quickly than when no users are viewing information about devices in the home.

When a user starts viewing information about devices in the home with user device 440, user device 440 may establish a network connection to servers 410, and servers 410 may transmit information about devices to user device 440. Servers 410 may also have a network connection (either direct or indirect) with power monitor 150. Accordingly, servers 410 may transmit information to power monitor 150 to cause the operations of power monitor 150 to change. Any operations of power monitor 150 may be changed to improve the user experience for the end user. In some implementations, power monitor 150 may change its operations to identify new devices and state changes of new devices more quickly. For example, power monitor may increase a polling frequency used to poll other devices in the house. Where no users are viewing information about devices, a polling frequency of 5 minutes may be sufficient to determine updates. When a user starts viewing information about devices, the polling frequency may be increased (e.g., 10 seconds) to more quickly determine updates.

The arrangement and specific functions of the components of FIG. 1 and FIG. 2 provide just one example of how the techniques described herein may be implemented, but other configurations are possible. For example, power monitor 150 may perform some or all the operations of servers 410, and power monitor 150 may directly provide information to user device 440. In another example, power monitor 150 may include some or all of the functionality of user device 440, and a user may interact directly with power monitor 150 to obtain information about device events and power consumption.

Identifying Devices

When power monitor 150 is first installed in a home, a device list may be created for devices in the home. In some implementations, an empty device list may be created. In some implementations, a device list may be initialized with devices based on input from one or more people in the home. For example, a user may specify any of the types, makes, and/or versions of devices in the house.

Power monitor 150 may use one or both of power monitoring and network monitoring to add or update devices in the device list using any of the techniques described herein. Devices may be added to the device list after they are identified by power monitor, and devices on the device list may be further updated as additional information about them is determined. For example, power monitor 150 may initially determine that the house has a dishwasher, and it may later determine that the house has a Kenmore 1000 dishwasher.

In some implementations, power monitor 150 may add multiple devices to the device list in response to processing a power event in the power monitoring signal. For example, if two power models produce a score above a threshold, then devices corresponding to each power model may be added to the device list. In some implementations, the scores produced by the power models may be included in the device list as well.

Power monitor 150 may also process network data to identify devices in the house and add them to the device list. For example, power monitor 150 may use any of the techniques described above to obtain information about devices connected to a network in the house, and then add devices to the device list for the house.

In some implementations, power monitor 150 may add multiple devices to the device list (optionally with scores) in response to processing a network data transmission. For example, in response to processing a broadcast message, a Toshiba television may be added to the device list with a first score and a Sony television may be added to the device list with a second score.

Scores for devices on the device list may be updated over time. For example, processing a first power event may cause a first device and a second device to be added to the device list with corresponding scores. At a later time, power monitor 150 may process a second power event to generate a second set of scores for the first and second devices. The second set of scores generated using the second power event may be used to update the overall scores for the first and second devices on the device list.

Similarly, network data transmissions at later times may be used to update a score for a device on a device list. For example, a first and second device may be added to a device list with corresponding scores based on processing a first network transmission. At a later time, power monitor 150 may process a second network transmission and generate second scores for the first and second devices. As above, the second set of scores generated using the second network transmission may be used to update the overall scores for the first and second devices on the device list.

In some implementations, a device on a device list may have a score that is generated using both power monitoring and network monitoring. A first device may be added to the device list with a corresponding score after processing a power event. Later, the score for the first device may be updated by processing a first network transmission. An overall score for a device on the device list may be generated by any combination of processing power events and network transmission events.

Scores may be combined using any appropriate techniques. In some implementations, an overall score for a device may be an average of all individual scores generated for that device. In some implementations, a variance may be determined for each of the scores, and the scores may be normalized (e.g., Z-scored) before being combined.

In some implementations, power monitor may simultaneously use both power monitor monitoring and network monitoring to identify devices. For a device that is connected to the electrical line and has a network connection, the device may, around the time of a state change, cause a power event in the power monitoring signal and transmit data over the network (a network event). Power monitor 150 may simultaneously process both the power event and the network event to identify the device.

The power event and network event may appear in either order. For example, a power event may correspond to the television being turned on, and afterwards a network event may correspond to a broadcast message by the television announcing the availability of services. For another example, a user may turn off the television and a network event may be a broadcast message withdrawing services, and afterwards a power event may correspond to the television turning off.

When processing a power event, power monitor 150 may look for network events that are temporally close to the power event (e.g., within a time interval, such as within 1 second) and process them simultaneously. For example, power monitor 150 may process network events where the difference between the time of the power event and the time of the network event is less than a threshold. Similarly, when processing a network event, power monitor 150 may look for power events that are temporally close to network event.

In some implementations, power monitor 150 may process a power event and generate scores for corresponding power models. Power monitor 150 may then look for network events that are temporally close to the power event and use information from the network event to adjust the scores generated by the power models. For example, the top two scoring power models may be for a Toshiba television and a Sony television and the scores may be close to each other. A network event may occur shortly after the power event, and the network event may correspond to a Toshiba television. Power monitor 150 may use the network event to increase the score for identifying a Toshiba television and then identify a Toshiba television and add it to the device list.

A time difference between a power event and a network event may also be used to identify devices. A device may send out a network event with a consistent delay after causing a power event or vice versa. For example, a television turning on may consistently send out a network event (e.g., broadcasting services) at about 3.5 seconds after causing a power event. The timing of the power events and network events may be a feature that may be used with any of the identification techniques described herein.

In some implementations, device identification models may be used that receive both information about a power event and information about a network event as input and then generate scores indicating a match between the input and a device. For example, a device identification model may be created for a type of device, a make of a device, or a version of a device. In some implementations, power monitor 150 may compute a score for each device identification model, select a device identification model having a highest score, and identify the device using the highest scoring device identification model. Device identification models may be created using any appropriate classification techniques, such as neural networks, self-organizing maps, support vector machines, decision trees, random forests, logistic regression, Bayesian models, linear and nonlinear regression, and Gaussian mixture models.

In some implementations, confidence levels may be computed in addition to scores, and the confidence levels may be used in determining whether to add a device to the device list or update information about a device in the device list. For example, where only one score is above a threshold and the score is much higher than all of the other scores, then the confidence level may be high. Where multiple scores are above the threshold, no scores are above the threshold, or the highest score is close to the second highest score, then the confidence may be low. Any appropriate techniques may be used to determine a confidence level for the highest scoring device state change. Where a highest scoring model (e.g., power model, network model, or device identification model) has a low confidence level, the device list may not be updated.

Devices may also be removed from the device list. For example, a user may review the device list and remove devices that are not present in the house. Devices may also be removed from the device list automatically. For example, a device may be removed if it hasn't been identified for longer than a threshold period of time, if an overall score for the device falls below a threshold, or sufficient data has been obtained to distinguish the device from alternative devices (e.g., enough data has been collected to determine with confidence that the television is a Toshiba television and not a Sony Television).

The techniques described above use a combination of power monitoring and network monitoring to provide improved identification of devices in a building over techniques based on only power monitoring. With only power monitoring, some devices may not be able to be identified at all or may be identified but with a lower accuracy. The combination of network monitoring with power monitoring allows a greater number of devices to be identified (such as networked devices without mechanical components) and devices may also be identified with greater accuracy. Using information from both power monitoring and network monitoring allows for the creation of models and/or classifiers with a lower error rate than models and/or classifiers that use only information from power monitoring.

Identifying Device State Changes

In addition to identifying devices in the house, power monitor 150 may also determine the states of devices in the house using one or both of power monitoring and network monitoring. Some devices (e.g., light bulbs) may only have two states, on and off. Other devices may have multiple states. For example, a clothes washer may have a wash cycle, a rinse cycle, and a spin cycle. A television may have an on state, an off state, and a sleep state.

Power monitoring may be used to identify state changes using any of the techniques described herein and in U.S. Pat. No. 9,443,195. For example, power monitor 150 may process the power monitoring signal, select a power model that produced a highest score, determine the device state change from the model, and update the state of the device in the device list.

Network monitoring may also be used to identify state changes using any of the techniques described herein. For example, power monitor may process broadcast messages, poll devices, and monitor device network data to determine the states of devices from their network data as described above.

In some implementations, power monitor may simultaneously use both power monitoring and network monitoring to identify device state changes. For a device that is connected to both the electrical line and a network connection, the device may, around the time of a state change, cause a power event in the power monitoring signal and transmit data over the network (a network event). Power monitor may process both the power event and the network event to identify the state change. The power event and network event may appear in either order as described above.

As above, when processing a power event, power monitor may look for network events that are temporally close to the power event and process them simultaneously. For example, power monitor may process network events where the difference between the time of the power event and the time of the network event is less than a threshold. Similarly, when processing a network event, power monitor may look for power events that are temporally close to network event.

In some implementations, power monitor may process a power event and generate scores for corresponding power models. Power monitor may then look for network events that are temporally close to the power event and use information from the network event to adjust the scores generated by the power models. For example, the top two scoring power models may be a Toshiba television turning on and a computer turning on and the scores may be close to each other. A network event may occur shortly after the power event, and the network event may correspond to a Toshiba television turning on. Power monitor may use the network event may to increase the score for the Toshiba television turning on. For example, the score may be increased by a fixed amount, a percentage, or may be combined with a score generated by the network event processing to generate an overall score for the device state change. Power monitor may then identify the state change as corresponding to the Toshiba television turning on. The timing of power events and network events may also be used as a feature for any of the techniques described herein for determining device state changes.

For some devices, the timing between a device state change and network events may not be precisely known. For example, in some implementations, it may be determined that a device is off when the device has not transmitted any network data for a period of time. It may thus be determined that the device turned off sometime after its last network transmission, but the time it was turned off may not be known. In some implementations, power monitor may process network events to determine a time varying score. For example, where a device's last network transmission was at a first time, power monitor may output a higher score for the time period shortly after the first time and a lower score for later times, such as a score with an exponential decay.

Some devices may have a known rebroadcast window, where the device will rebroadcast at set time intervals the services provided by the device. Where the device has sent out a broadcast, but the device has not sent out another broadcast within the rebroadcast window, it may be determined that the device has been turned off.

In some implementations, state change models may be used that receive both information about a power event and information about a network event as input and then generate scores indicating a match between the input and a device state change. For example, a state change model may be created for each state change of a device (e.g., state changes for a type of device, a make of a device, or a version of a device). In some implementations, power monitor may compute a score for each state change model, select a state change model having a highest score, and identify the state change using the highest scoring state change model. State change models may be created using any appropriate classification techniques, such as neural networks, self-organizing maps, support vector machines, decision trees, random forests, logistic regression, Bayesian models, linear and nonlinear regression, and Gaussian mixture models.

As above, confidence levels may be computed in addition to scores, and the confidence levels may be used in determining whether a state change has occurred. Where a highest scoring model (e.g., power model, network model, or state change model) has a low confidence level, the state change may not be identified.

In determining device state changes, power monitor 150 may use a list of known states of devices and possible transitions between the states of devices. For example, a television may have three states: an on state, an off state, and a sleep state. Because of how the television operates, however, not all state transitions may be possible. For the three states, there are six possible state transitions (on to off, on to sleep, off to on, off to sleep, sleep to on, and sleep to off). From the "off" state, it may only be possible to transition to the "on" state (off to sleep is not possible). From the "sleep" state, it may only be possible to transition to the "on" state (sleep to off is not possible). Accordingly, power monitor may implement techniques (e.g., models or rules) for recognizing all of the possible state changes of devices. When determining a state change of a device, power monitor may select a state change from a list of possible state changes of the device, and the current state may be determined from the ending state of the state change (e.g., when selecting an off to on state change, it is determined that the device is now on). When determining a state of a device, power monitor may select a state from a list of possible states of the device. Power monitor may select state changes or states depending on the implementation and/or the device being monitored.

Any of the techniques described above for identifying devices may also be used for determining state changes of devices. Similarly, any of the techniques described for determining state changes of devices may also be used to identify devices.

The techniques described above use a combination of power monitoring and network monitoring to provide improved identification of device state changes in a building over techniques based on only power monitoring. With only power monitoring, some device state changes may not be able to be identified at all or may be identified but with a lower accuracy. The combination of network monitoring with power monitoring allows a greater number of device state changes to be identified (such as state changes of networked devices without mechanical components) and device state changes may also be identified with greater accuracy. Using information from both power monitoring and network monitoring allows for the creation of models and/or classifiers with a lower error rate than models and/or classifiers that use only information from power monitoring.

Smart-Plug Power Monitoring

A smart plug in the house may provide power to one or more devices that receive power from the smart plug, such as smart plug 145 of FIG. 1 and FIG. 2. A smart plug may have a single receptacle that allows a single device to be plugged into the smart plug or may have multiple receptacles that allow multiple devices to be plugged into the smart plug (which may be referred to as a smart power strip). Where a smart plug has a single receptacle, a conventional power strip may be plugged into the smart plug to allow multiple devices to receive power from the smart plug. A smart plug may also be combined with a conventional electrical outlet so that the smart plug is directly wired to the electrical system of the house.

As used herein, a smart plug is a device that receives electrical power from a circuit of a building (e.g., circuit 222 of FIG. 2), provides power to one or more other devices (connected devices), has a sensor to measure information about power transmitted to the one or more connected devices, and has a network connection (wired or wireless) to transmit information about measured power to other devices, such as a power monitor. A smart plug may also provide other functionality, such as allowing a user to effectively turn off connected devices by opening a relay in the smart plug.

Smart plugs in a house provide additional information about power consumption of devices that may be used to improve the operation of a power monitor. Because a smart plug provides information about a subset of devices in the house, it may be more effective to use information received from the smart plug (such as a smart-plug power monitoring signal) to determine information about the devices connected to the smart plug (as compared to a main power monitoring signal that includes information about a larger number of devices). For some smart plugs, however, the information provided by the smart plug may be less detailed (e.g., with a lower sampling rate) and/or less accurate than the main power monitoring signal obtained by the power monitor. Accordingly, there may be advantages to using both information from a smart plug and information from an electrical main.

A power monitor may obtain information from the smart plug using any appropriate network connections and techniques. For example, a power monitor may establish a direct network connection with a smart plug (e.g., using Bluetooth or Wi-Fi direct) or may connect via a local area network of the house. In some implementations, a power monitor may receive information from the smart plug via a server computer external to the house. For example, the smart plug may send information to a server computer and the server computer may transmit the information to the power monitor. The server may be operated by the company that provides the power monitor or the company that provides the smart plug. In some implementations, a smart plug may send information to a smart plug server operated by the company that provides the smart plug, and the smart plug server may transmit the information to a power monitor server operated by the company the provides the power monitor. The power monitor server may perform the necessary processing on the information received from the smart plug or transmit the information to the power monitor for processing.

Comparing Power Events and Power Monitoring Signals

The techniques described herein may compare a main power monitoring signal (e.g., a first-main or second-main power monitoring signal) to a smart-plug power monitoring signal (where the smart plug receives power from that main). For example, where a power event appears in a main power monitoring signal, it may be desired to know whether that main power event is a match to a power event in the smart-plug power monitoring signal. Where the two power events are a match, then it can be determined that the main power event was likely caused by a device that receives power from the smart plug. Where the two power events are not a match, then it may be determined that the main power event was likely caused by a device that does not receive power from the smart plug.

A main power monitoring signal may be compared with a smart-plug power monitoring signal by comparing portions of the respective power monitoring signals. For example, a Euclidean distance (a sum of squares of a difference between the two power monitoring signals), a cosine similarity, or any other appropriate comparison may be used.

In some implementations, a smart-plug portion or a main portion may be modified before performing a comparison. Where the two portions being compared have different sampling rates, a portion may be resampled to match the sampling rate of the other portion. For example, a main portion may have a higher sampling rate than a smart-plug portion, and the main portion may be down sampled to the sampling rate of the smart-plug portion. One or both portions may be scaled using an appropriate metric. For example, one or both portions may be modified so that each portion has the same L2 norm. One or both portions may be translated in time to obtain a more accurate comparison. For example, a time translation may be determined to maximize the similarity between the portions (e.g., determining a translation by performing a convolution of the portions), and the comparison may be made using this time translation.

In some implementations, a comparison may be computed using baseline values of the smart-plug power monitoring signal and/or the main power monitoring signal. The main power monitoring signal may indicate the power consumption of many devices in the house that are not connected to the smart plug and thus include values that may not be directly comparable to the smart plug. To obtain an improved comparison, a baseline power consumption for a main may be computed as an amount of power in the main power monitoring signal at a time before a power event. For example, the baseline power consumption for a main may be the power value at a point in time prior to the power event (e.g., three seconds) or may be an average amount (or any other appropriate statistic, such as median or mode) of power consumption during a window of time prior to the power event (e.g., 3-13 seconds before the power event). When comparing a smart-portion with a main portion, the main portion may be normalized by subtracting the baseline of the main from each power value of the main portion. A comparison may then be performed between the smart-plug portion and the normalized main portion.

For example, in FIG. 3A, a first-main portion may be collected around power event 310. Prior to this power event, the amount of power consumed by the first-main was about 1000 watts. Accordingly, a baseline value of 1000 watts may be used to normalize the first-main portion by subtracting 1000 watts from each time-series value of the first-main portion.

A main power monitoring signal may be compared with a smart-plug power monitoring signal by comparing features of power events in the respective power monitoring signals. Any appropriate features may be computed, such as any of the features described in U.S. Pat. No. 9,443,195. For example, a feature may be a difference in time or time delay between a power event in a main power monitoring signal and a power event in a smart-plug power monitoring signal. For another example, a feature of a power event may be a change in an amount of power before the power event and after the power event. An amount of power before the power event may be determined by taking a power measurement at a time before the power event or an average (or median or some other statistic) over a window of time before the power event. An amount of power after the power event may similarly be determined. To compare a main power monitoring signal with a smart-plug power monitoring signal, a first power change for a first power event in the main power monitoring signal may be compared with a second power change for a second power event in the smart-plug power monitoring signal. In some implementations, a first feature vector may be created for a power event in a smart-plug power monitoring signal and a second feature vector may be created for a power event in a main power monitoring signal. A comparison may be computed using the feature vectors, such as by computing a distance or similarity between the feature vectors.

A main power monitoring signal may be compared with a smart-plug power monitoring signal using wattage models for devices. Any appropriate wattage models may be used, such as the wattage models described in U.S. Pat. No. 9,443,195. A wattage model may describe an expected amount of power consumption for a device over time after the device changes state. A main power monitoring signal may include power events from different devices that occur at similar times such that the two power events overlap with each other. The wattage models may be used to separate the two power events in the main power monitoring signal so that each of the power events may be compared with the smart-plug power monitoring signal.

Determining Main of Smart Plug

In some implementations, it may be desired or useful to know which main of the house that the smart plug is connected to. For example, knowing the main that the smart plug receives power from may improve other techniques that use information from the smart plug as described in greater detail below. A smart plug could potentially receive power from more than one main of a house (such as a smart plug for a 240V devices), but the discussion below will focus on a smart plug that receives power from a single main and similar techniques could also be applied to a smart plug that receives power from more than one main.

The electrical main of the smart plug can be determined by comparing a smart-plug power monitoring signal received from the smart plug with a first-main power monitoring signal and a second-main power monitoring signal. For devices that are connected to the smart plug, power events from state changes of the devices may appear in the smart-plug power monitoring signal and either the first-main or second-main power monitoring signal.

For example, consider the power monitoring signals of FIGS. 3A-C. In FIG. 3C, the smart-plug power monitoring signal shows power events from a toaster oven that is connected to the smart plug. Because the smart plug receives power from the first-main, the power events of the toaster oven also appear in the first-main power monitoring signal of FIG. 3A. The first-main power monitoring signal also includes power events of other devices on the first-main that are not connected to the smart plug (e.g., the light bulb), so the smart-plug power monitoring signal includes only a subset of power events that appear in the first-main power monitoring signal. The power events of the toaster oven do not appear in the second-main power monitoring signal because the smart plug does not receive power from the second-main.

Although the power events from the smart plug also appear in the first-main power monitoring signal, it may not be straightforward to determine in which main the power events of the smart plug appear. For example, the main power monitoring signals may contain a large number of power events that overlap with one another, there may be devices in the house that are not connected to the smart plug that have power events with similar signatures to the power events of the devices that are connected to the smart plug, and/or the smart-plug power monitoring signal may have a time delay, resolution (e.g., sampling rate), or amplitude that is different with respect to the main power monitoring signals.

Figure 6:
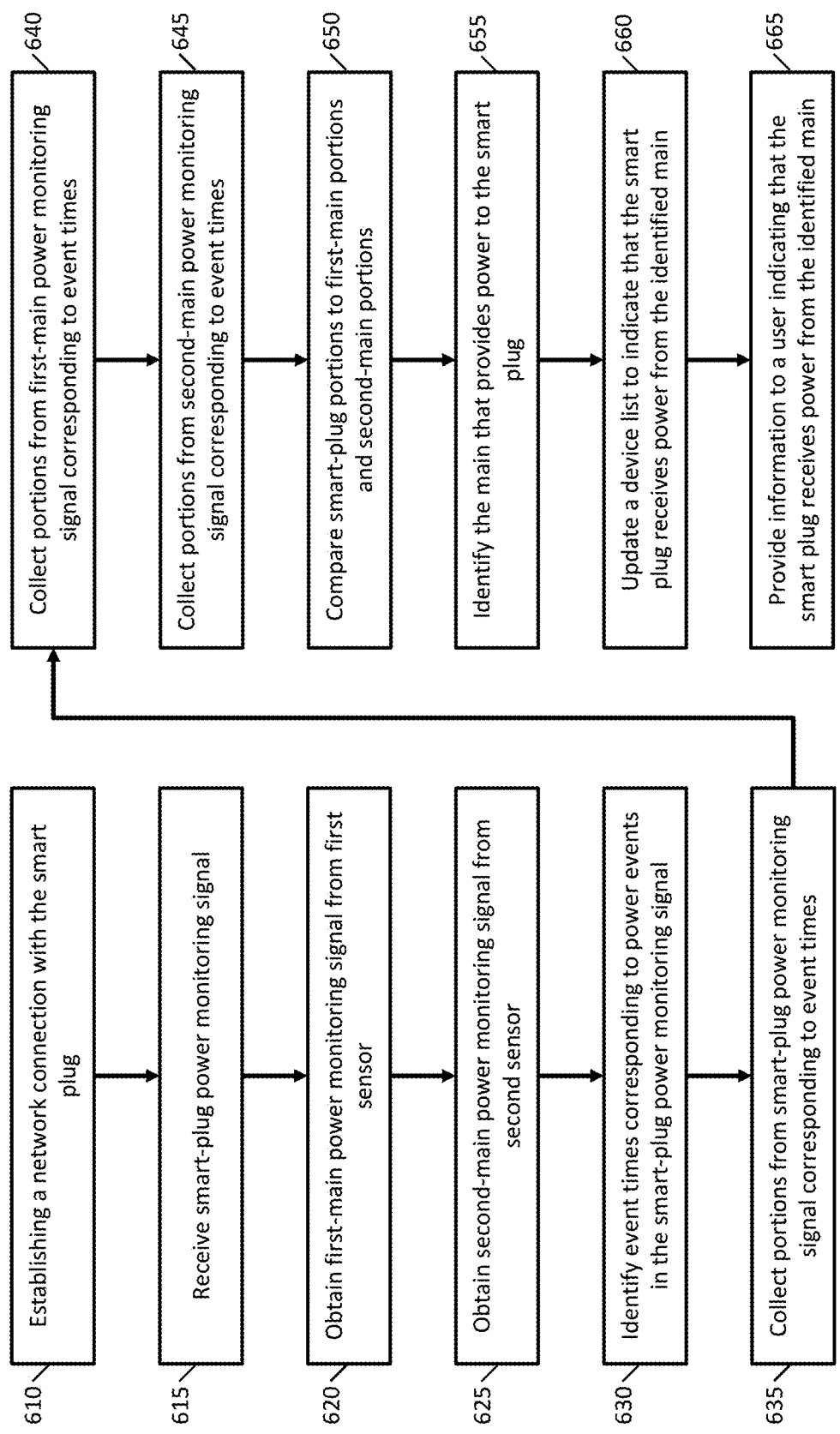
FIG. 6 is a flowchart of an example implementation of identifying an electrical main that provides power to a smart plug.

FIG. 6 is a flowchart of an example implementation of determining the main that provides power to a smart plug. In FIG. 6 and other flowcharts herein, the ordering of the steps is exemplary and other orders are possible, not all steps are required, and, in some implementations, some steps may be omitted, or other steps may be added. The process of the flowcharts may be implemented, for example, by any of the computers or systems described herein.

At step 610, a network connection is established between a power monitor and a smart plug. Any appropriate network connection may be used (e.g., wired or wireless, Wi-Fi, Bluetooth) and the network connection may be direct or indirect. For example, the network connection may be via a router of the house or via a computer that is external to the house. The network connection may be established using any appropriate techniques. For example, a user may configure one or both of the power monitor and the smart plug to create a network connection, or the power monitor and/or smart plug may establish a network connection automatically without needing configuration by a person.

At step 615, the power monitor receives a smart-plug power monitoring signal from the smart plug. In some implementations, the smart-plug power monitoring signal may provide a real time (or near real time) measurement of the amount of power (or other electrical property) provided to devices connected to the smart plug. In some implementations, the smart plug may only transmit a power monitoring signal when the amount of power provided is greater than zero or some other threshold. Signal 303 of FIG. 3C is an example smart-plug power monitoring signal.

At step 620, a first-main power monitoring signal is obtained using measurements (e.g., current or voltage) of an electrical property of the first-main of the house by a first sensor. The first-main power monitoring signal may provide a real time (or near real time) measurement of the amount of power (or other electrical property) provided to devices receiving power from the first-main. Signal 301 of FIG. 3A is an example first-main power monitoring signal.

At step 625, a second-main power monitoring signal is obtained using measurements (e.g., current or voltage) of an electrical property of the second-main of the house by a second sensor. The second-main power monitoring signal may provide a real time (or near real time) measurement of the amount of power (or other electrical property) provided to devices receiving power from the second-main. Signal 302 of FIG. 3B is an example second-main power monitoring signal.

At step 630, power events are detected in the smart-plug power monitoring signal, and event times of the power events are identified. A power event may correspond to any state change of a device connected to the smart plug, such as a device turning on, turning off, or events between an on event and an off event (such as the cycling of the heating element of a toaster oven while the toaster oven is on). Any appropriate techniques may be used to identify power events, such as any of the techniques described in U.S. Pat. No. 9,443,195.

Any subset of power events may be used. For example, all on events may be used, all off events may be used, all on and off events may be used, or all events may be used. An event time may be identified for each event, such as a beginning, middle, or end time of the event. For example, detected power events may be any of power events 310, 330, 340, 350, 360, and 380 of FIG. 3C.

An on event may be determined as a transition from providing zero power to providing non-zero power. Similarly, an off event may be determined as a transition from providing non-zero power to zero power. In determining, transitions between zero and non-zero power, appropriate thresholds may be used. For example, even when all devices connected to the smart plug are off, the smart plug may still indicate that a relatively small amount of power is being provided due to electrical leakage in the devices connected to the smart plug or the smart plug itself. A power level below a threshold may be determined to be zero power even though it may be not precisely zero.

Where more than one device is connected to the smart plug, it is possible that a first device is on and a second device later turns on. The second device turning on will thus cause a transition in the smart-plug power monitoring signal from non-zero power to a larger amount of power. Accordingly, when selecting all on events, only on events from zero to non-zero power may be used, or other techniques may be used to capture all on events when more than one device is connected to the smart plug.

At step 635, portions of the smart-plug power monitoring signal (or smart-plug portions) are collected corresponding to the event times. For example, a window of the smart-plug power monitoring signal may be collected around the event time (e.g., a ten second window) or a portion of the smart-plug power monitoring signal may be collected from a time before an on event to time after an off event. For example, possible smart-plug portions 311, 331, 341, 351, 361, and 381 are shown in FIG. 3C.

At step 640, portions of the first-main power monitoring signal (or first-main portions) are collected corresponding to the event times, and at step 645, portions of the second-main power monitoring signal (or second-main portions) are collected corresponding to the event times. The portions may be collected using similar time frames as the smart-plug portions or different time frames.

At step 650, the smart-plug portions are compared with the first-main portions and the second-main portions. Any of the techniques described herein may be used to compare a smart-plug portion with a first-main portion and a second-main portion.

Comparisons may be made between the smart-plug portion and the first-main portion for each power event, and comparisons may be made between the smart-plug portion and the second-main portion for each power event. For example, where there are 50 power events, 50 comparisons may be made between smart-plug portions and first-main portions and 50 comparisons may be made between smart-plug portions and second-main portions. Each comparison may be represented using any appropriate techniques, such as by representing a comparison as a number (e.g., a distance between portions).

At step 655, it is determined if the smart plug is powered by the first-main or the second-main using the results of the comparisons. Any appropriate techniques may be used. For example, a first score may be computed using the comparisons between the smart-plug portions and the first-main portions, and a second score may be computed using the comparisons between the smart-plug portions and the second-main portions. Any appropriate scores may be computed, such as a statistic of the Euclidean distances between portions. The statistic may be a mean, median, sum of squares, or any other appropriate statistic. In some implementations, it may be determined that the smart plug receives power from the first-main if the first score is larger than the second score or if the first score minus the second score is larger than a threshold. In some implementations, if the first score and second score are too close to each other, then the decision may be deferred as having low confidence and more data may be collected to obtain a more reliable determination.

At step 660, a device list, such as the device list of FIG. 5, is updated to indicate that the smart plug receives power from the main identified at step 655. A device list may be stored in any appropriate data store. Any other appropriate information may be stored, such as the date of the determination.

At step 665, information is provided to a user to inform the user that the smart plug is receiving power from the identified main, such as using any of the techniques described herein or in U.S. Pat. No. 9,443,195. In some implementations, step 665 may not be performed, and the user may not be informed regarding the main from which the smart plug is receiving power.

The process of FIG. 6 may be repeated at other times since, for at least some smart plugs, the plug may be plugged into a different electrical outlet and then receive power from a different main. For example, the process of FIG. 6 may be repeated once a day or once a week.

In some implementations, an artificial neural network may be used to determine the main that is providing power to a smart plug. Any appropriate neural network may be used, such as a recurrent neural network. A neural network may be trained using a training corpus of data where the training corpus includes multiple training examples. Each training example may include a smart-plug power monitoring signal, one or more main power monitoring signals, and an indication of the main that is providing power to the smart plug. For example, smart plug and main power monitoring signals may be collected over a period of time, such as a day or a week.

The parameters of the neural network may be trained using any appropriate techniques, such as back propagation and stochastic gradient descent. To train the neural network, the inputs of the neural network may be set to the power monitoring signals, the outputs of the neural network may be set to indicate the main that is providing power to the smart plug (e.g., setting a value of 1 for the main that is providing power to the smart plug and a value of 0 for the other mains). The parameters of the neural network may then be trained by iterating over the training data.

After the neural network has been trained, it may be used to determine the main that is providing power to the smart plug. Smart plug and main power monitoring signals may be collected from a house for processing by the trained neural network. The neural network may process the power monitoring signals and output a score for each main indicating whether the main provides power to the smart plug. For example, the scores may be probabilities or likelihoods. The scores may be used to identify the main that is providing power to the smart plug, such as by selecting a main having a highest score.

In some implementations, additional power monitoring signals may be collected to increase the confidence in the outcome. For example, after processing one day of power monitoring signals, the scores may be a 0.6 probability for a first-main and a 0.4 probability for a second-main. These scores may not provide sufficient confidence and additional data may be collected. After processing one week of power monitoring signals, the scores may be a 0.9 probability for the first-main and a 0.1 probability for the second-main. These scores may provide sufficient confidence to make a determination, and the first-main may be selected as providing power to the smart plug.

In some implementations, the main providing power to a smart plug may be identified as described in the following clauses and combinations of any two or more of them.

Determining Devices Connected to Smart Plug

In some implementations, it may be desired to know which devices in the house are receiving power from the smart plug. For example, if it is known which devices are connected to the smart plug, this information could be presented to a user. This information may be used to benefit the user or to improve the functionality of a power monitor.

For example, the user may connect a toaster oven to the smart plug, and the power monitor may be able to detect state changes of the toaster oven, but the power monitor may not know that the device connected to the smart plug is a toaster oven. The power monitor may have power models for detecting state changes of devices with heating elements (such as a toaster oven, stove, fish tank heater, or a curling iron) and these models may be able to detect state changes of the toaster oven without knowing that the device is a toaster oven. The power monitor may report to a user that "heating element 1" is connected to the smart plug. The user may see this, and then provide information indicating that the device connected to the smart plug is a toaster oven. Afterwards, the power monitor may be able to report that the toaster oven turned on instead of reporting that "heating element 1" turned on.

Knowing that the device connected to the smart plug is a toaster oven may also help with the identification of state changes of toaster ovens for other users. For example, a company providing power monitor services, may use the information received from the user to create power models for toaster ovens that may be used with the user's toaster oven and toaster ovens of other users.

In some instances, the information provided by the user may be used to correct mistakes by the power monitor and improve the processing of the power monitor for the user and other users. For example, the power monitor may incorrectly determine that a curling iron is connected to the smart plug and inform the user. The user may then correct this information by indicating the device connected to the smart plug is actually a toaster oven and not a curling iron. This information may be used by a company providing power monitoring services to potentially improve the power models for both toaster ovens and curling irons to better distinguish between the two types of devices.

Figure 7:
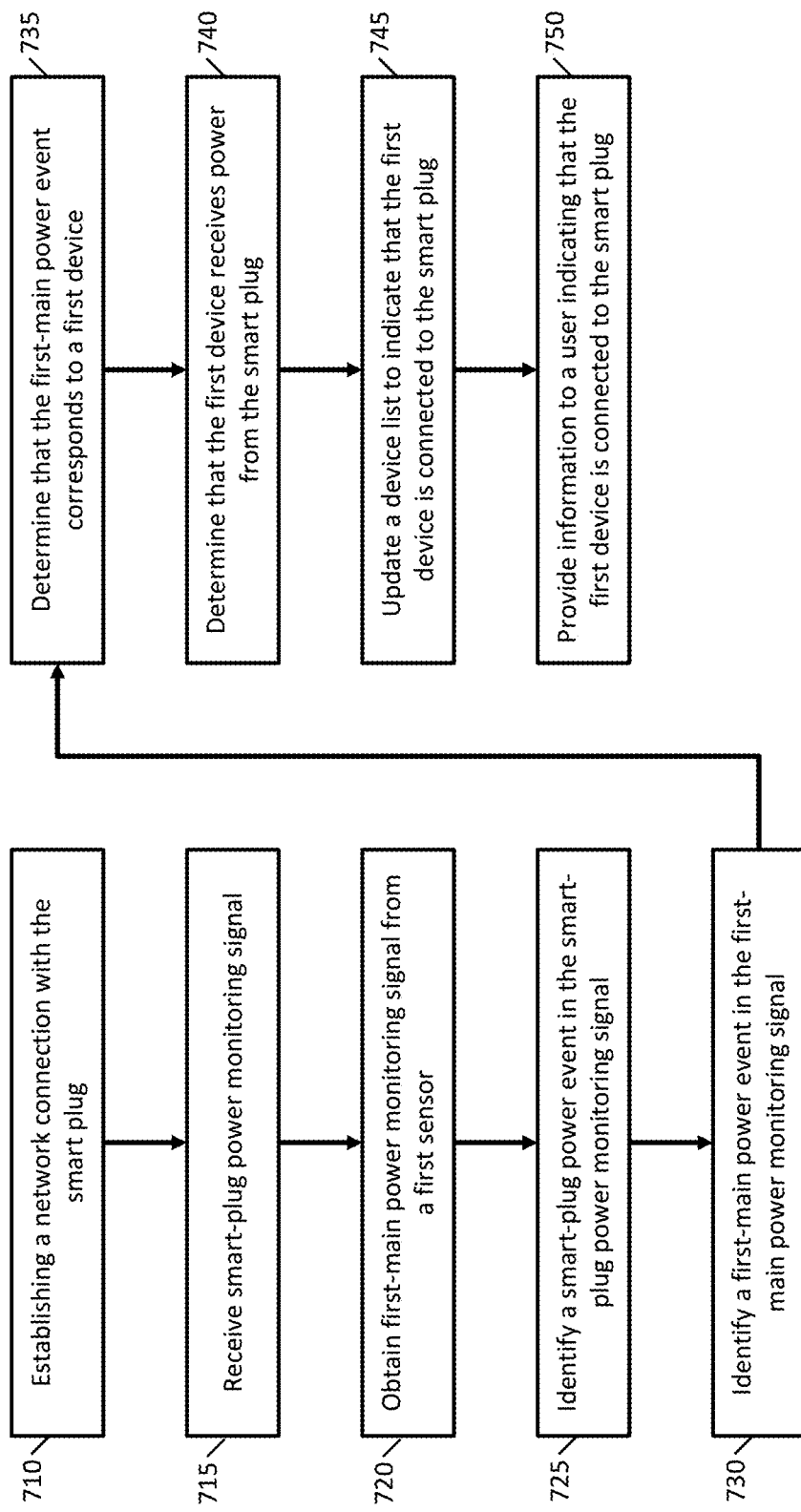
FIG. 7 is a flowchart of an example implementation of determining that a device receives power from a smart plug.

FIG. 7 is a flowchart of an example implementation of determining that a first device receives power from a smart plug. Before performing the steps of FIG. 7, it may be determined that the smart plug is receiving power from the first-main, such as by performing the steps of FIG. 6. At step 710, a network connection is established between a power monitor and a smart plug; at step 715, the power monitor receives a smart-plug power monitoring signal from the smart plug; and at step 720, a first-main power monitoring signal is obtained using measurements of an electrical property of the first-main of the house by a first sensor. These steps may be performed using any of the techniques described above for steps 610, 615, and 620.

At step 725, a smart-plug power event is identified in the smart-plug power monitoring signal, where the smart-plug power event occurs to an event time. Any appropriate techniques may be used to identify a power event, such as any of the techniques described in U.S. Pat. No. 9,443,195. In some implementations, a power event may be identified by detecting a transition in the smart-plug power monitoring signal from zero power to non-zero power (e.g., caused by a device connected to the smart plug being turned on). An event time may be determined using any appropriate techniques, such as a beginning, middle, or end of the power event.

In some implementations, at step 725, multiple smart-plug power events may be identified. For example, a smart-plug power monitoring signal may be processed for a duration of time, such as 24 hours or 7 days, and multiple smart-plug power events may be identified. The identified smart-plug power events may correspond to the same type of power event (e.g., a device turning on or a transition from zero power to non-zero power) or may include multiple types of power events (e.g., a device turning on and a device turning off).

Since it is known that the smart plug is receiving power from the first-main, the device that caused the smart-plug power event will also cause a power event in the first-main power monitoring signal at around the event time.

At step 730, a first-main power event is identified in the first-main power monitoring signal using the event time determined at step 725. Any appropriate techniques may be used to select the first-main power event. For example, the first-main power monitoring signal may include multiple power events near the event time, and a power event that is closest to the event time may be selected. In some implementations, there may be a known time delay, or a time delay may be measured between the smart-plug power monitoring signal and the first-main power monitoring signal. This known or measured time delay may be used in selecting the first-main power event.

In some implementations, more than one power event of the first-main power monitoring signal may be identified as step 730. For example, the first-main power monitoring signal may contain a first first-main power event and a second first-main power event that are close in time to the event time. Each of the first first-main power event and the second first-main power event may be compared with the smart-plug power event (or portions of power monitoring signals containing the power events may be compared). The first-main power event that has the closest comparison to the smart-plug power event may be selected.

Where multiple smart-plug power events are identified at step 725, a first-main power event may be identified at step 730 for each smart-plug power event using the techniques described above. Accordingly, after step 730, multiple pairs of smart-plug power events and first-main power events may be available for further processing.

At step 735, the identified first-main power event is processed to determine that the first-main power event corresponds to a first device. For example, the first-main power event may be processed by a plurality of power models where each power model corresponds to a device (e.g., a type of device (a television), a make/version of a device (A Toshiba television), or a particular device (the living room television)). Each power model may output a score indicating a match between the first-main power event and the device corresponding to the power model. The first device may be selected by processing the scores, such as by selecting a power model having a highest score.

In some implementations, a state change of a device may be identified, and the device may be identified from the state change. For example, each of the power models may correspond to a state change of a device, and a power model may be selected using model scores, and where the state change corresponds to a state change of the first device, it may be determined that the power event corresponds to the first device.

Where multiple pairs of smart-plug power events and first-main power events are identified at steps 725 and 730, step 735 may be performed for each first-main power event to identify a device (which may be the first device or a different device) corresponding to the power event.

At step 740, it is determined that the first device receives power from the smart plug. Where only one first-main power event was processed at step 735, it may be determined that the first device receives power from the smart plug as a result of the first-main power event corresponding to the first device and the first-main power event corresponding to the smart-plug power event.

Where multiple first-main power events are identified and processed at steps 725 to 735, other techniques may be used to determine that the first device receives power from the smart plug.

In some implementations, a count of devices identified at step 735 for multiple first-main power events may be used to determine that the first device receives power from the smart plug. For example, suppose that 100 first-main power events are processed at step 735, and that 75 were determined to correspond to the first device, 15 to correspond to a second device, and 10 to correspond to a third device. Since the first device had the highest count, it may be selected as receiving power from the smart plug.

In some implementations, comparisons between smart-plug power events and first-main power events may be used to make the determination at step 740. A smart-plug power event and a first-main power event (or portions of power monitoring signals containing the power events) may be compared using any of the techniques described herein. Each comparison may generate a distance between power the events (or corresponding portions of power monitoring signals). The distances may then be used to determine that the first device receives power from the smart plug.

For example, for each first-main power event that is determined to correspond to the first device at step 735, a distance may be computed between the first-main power event and the corresponding smart-plug power event. As a result, a plurality of distances may be computed for the first device. The plurality of distances for the first device may be combined into a score, such as by using any of the techniques described above for step 655. This score for the first device may then be used to determine if the first device receives power from the smart plug. For example, the score for the first device may be compared to a threshold, or the value for the first device may be compared to similar score computed for other devices, and a device with a highest score may be selected.

In some implementations and instances, a smart plug may provide power to more than one device (e.g., a smart power strip). In such instances, more than one device may be selected as receiving power from the smart plug. For example, all devices with a score (e.g., computed from distances as described above) above a threshold may be selected as receiving power from the smart plug.

At step 745, a device list, such as the device list of FIG. 5, is updated to indicate that the first device receives power from the smart plug. A device list may be stored in any appropriate data store. Any other appropriate information may be stored, such as the date of the determination.

At a later time, the first device may be removed from the smart plug and plugged directly into an electrical outlet. Afterwards, it may be determined that the first device is no longer receiving power from the smart plug and the device list may be updated to indicate that the first device is no longer receiving power from the smart plug. For example, a power event may be detected in the first-main power monitoring signal at an event time. This power event may be processed with power models to determine that the power event corresponds to the first device transitioning from an off state to an on state, and accordingly that the first device is receiving power after the power event. The smart-plug power monitoring signal may then be processed to determine whether it contains a power event corresponding to the first device turning on at approximately the event time. Where it does not (e.g., the smart-plug power monitoring signal indicates that no power is being provided to any devices) then it may be determined that the first device is no longer connected to the smart plug.

At step 750, information is provided to a user to inform the user that the first device is receiving power from the smart plug, such as using any of the techniques described herein or in U.S. Pat. No. 9,443,195. In some implementations, step 750 may not be performed, and the user may not be informed that the first device is receiving power from the smart plug.

In some implementations, a device connected to a smart plug may be identified as described in the following clauses and combinations of any two or more of them.

Identifying Device State Changes Using a Smart Plug

The information about which devices are connected to a smart plug may be used to improve the identification of device state changes in the house. For example, suppose that it is known that a first device is connected to a smart plug (e.g., using the method of FIG. 7) and that a second device is not connected to a smart plug.

The knowledge of which devices are connected to the smart plug in combination with the smart-plug power monitoring signal may be used to increase the accuracy of identifying device state changes in the house. The first device and the second device may have similar electrical signatures, and it may thus be more likely that state changes of the first device are mistakenly identified as state changes of the second device (or vice versa). Since it is known that the first device is connected to the smart plug and the second device is not, this information may be used to reduce the likelihood of making mistakes when identifying state changes of the first and second devices.

For example, a first-main power event may be detected in the first-main power monitoring signal at an event time. When information from a smart plug is not available, this first-main power event may be processed with the first power models for the first device and the second power models for the second device (and possibly other power models) to identify the device state change corresponding to the first-main power event. Because the first and second devices have similar signatures, a first-main power event caused by the first device may be incorrectly identified as a state change of the second device and vice versa.

The smart-plug power monitoring signal may be used to reduce the error rate. For example, where the smart-plug power monitoring signal indicates that no power is being provided to connected devices at or near the event time, this information may be used to improve the accuracy of identifying a device state change from the first-main power event. Because that smart plug indicates that it is not providing power, it may be presumed that the first device is off and accordingly that the first-main power event cannot correspond to the first device. Accordingly, the first-main power event may be processed by a subset of all the available power models that excludes power models corresponding to the first device. Because power models corresponding to the first device are excluded, an error rate in identifying state changes may be reduced. For example, where the first-main power event corresponds to a state change of the second device it cannot be incorrectly identified as a state change of the first device since the first power models for the first device are not being used.

Figure 8A:
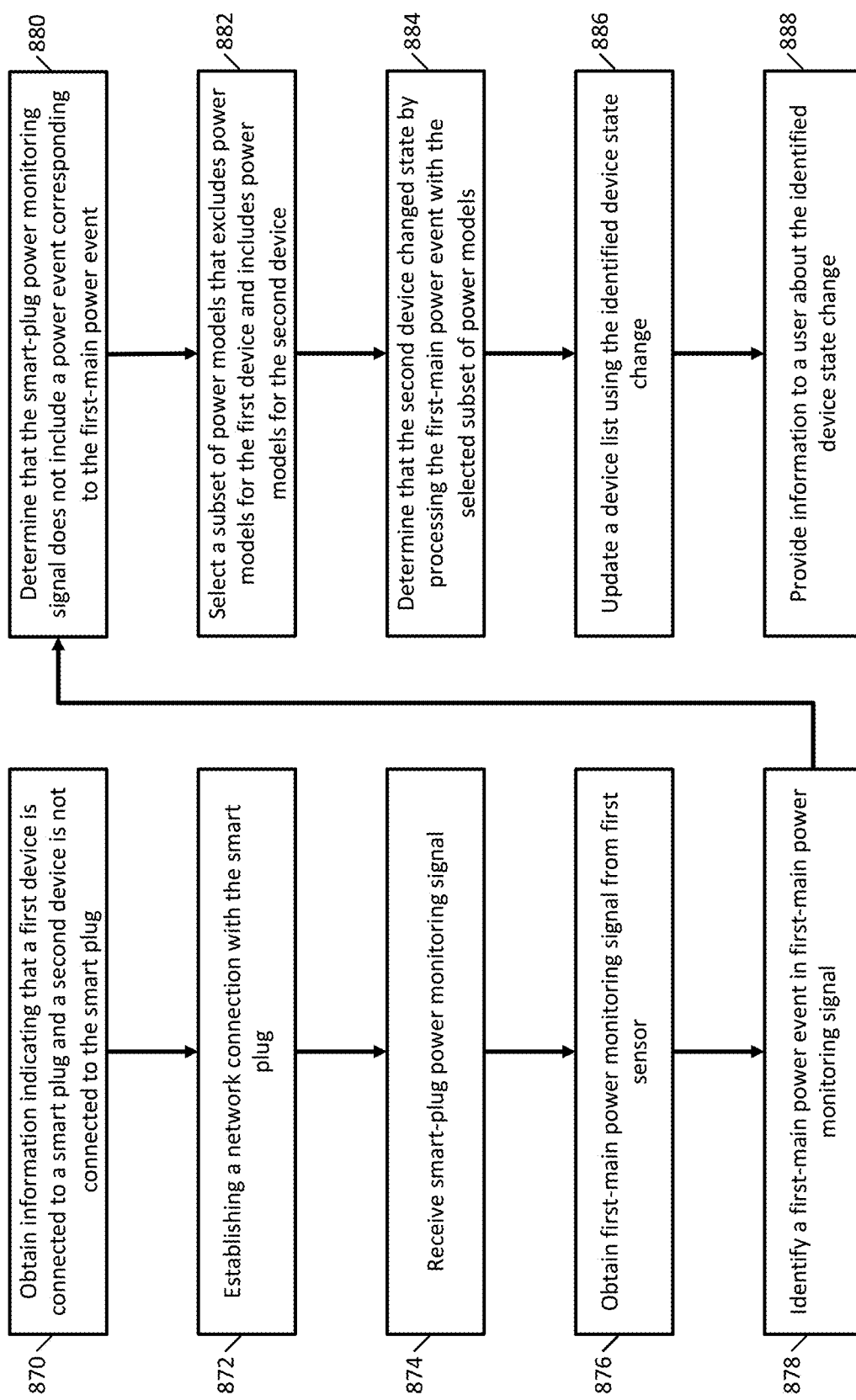
FIGS. 8A and 8B are flowcharts of example implementations of identifying device state changes using a main power monitoring signal and a smart-plug power monitoring signal.

FIG. 8A is a flowchart of an example implementation of determining device state changes using a smart-plug power monitoring signal. Before performing the steps of FIG. 8A, it may be determined that the smart plug is receiving power from the first-main, such as by performing the steps of FIG. 6. It may also be determined that a first device is connected to the smart plug, such as by performing the steps of FIG. 7.

At step 870, information is obtained indicating that a first device is connected to a smart plug and that a second device is not connected to the smart plug. For example, the information may be obtained from a device list, such as any of the device lists described herein.

At step 872, a network connection is established between a power monitor and a smart plug; at step 874, the power monitor receives a smart-plug power monitoring signal from the smart plug; and at step 876, a first-main power monitoring signal is obtained using measurements of an electrical property of the first-main of the house by a first sensor. These steps may be performed using any of the techniques described above for steps 610, 615, and 620.

At step 878, a first-main power event is identified in the first-main power monitoring signal. Any appropriate techniques may be used to identify the first-main power event, such as any of the techniques described in U.S. Pat. No. 9,443,195.

At step 880, it is determined that the smart-plug power monitoring signal does not contain a power event corresponding to the first-main power event. Any appropriate techniques may be used. A first time of the first-main power event may be used to process a portion of the smart-plug power monitoring signal that includes or is close to the time of the first-main power event. In some implementations, it may be determined that the smart-plug power monitoring signal does not contain a power event corresponding to the first-main power event if the smart-plug power monitoring signal has a value of zero (or close to zero) during a window of time around the first time.

In some implementations, the first-main power event may be compared with power events in the smart-plug power monitoring signal that are near the first time, such as by using any of the techniques described herein. If the first-main power event is not similar to any of the power events in the smart-plug power monitoring signal, then it may be determined that the smart-plug power monitoring signal does not contain a power event corresponding to the first-main power event.

At step 882, a subset of power models is selected from a plurality of power models where the subset excludes at least one power model for the first device and includes at least one power model of the second device. The power models for the first device may be excluded, for example, since the first device is connected to the smart plug, and the smart plug indicates that no power is being consumed for devices connected to the smart plug.

At step 884, it is determined that the second device changed state by processing the first-main power event with the selected subset of power models. For example, each power model may compute a score indicating a match between the first-main power event and a device state change, and a device state change may be selected that corresponds to a highest score.

At step 886, a device list is updated using the identified device state change at step 884. A device list may be stored in any appropriate data store.

At step 888, information about the device state change identified at step 884 may be provided to a user, such as using any of the techniques described herein or in U.S. Pat. No. 9,443,195. In some implementations, step 888 may not be performed, and the user may not be informed about the device state change.

A variation of the flowchart of FIG. 8A may also be used when identifying state changes of the first device that is connected to the smart plug. At step 880, it may instead be determined that the smart-plug power monitoring signal does contain a power event corresponding to the first-main power event. For example, the first-main power event may be compared with the power events of the smart-plug power monitoring signal, and it may be determined that features of the first-main power event are close to features of a smart-plug power event. At step 882, at least one power model of the second device may be excluded and at least one power model of the first device may be included. At step 884, it may be determined that the first device changed state by processing the first-main power event with the selected subset of power models. Accordingly, the processing of FIG. 8A may be used to identify state changes of devices that are connected to smart plugs and state changes of devices that are not connected to smart plugs.

In some implementations, device state changes may be identified as described in the following clauses and combinations of any two or more of them.

Clause 1. A computer-implemented method for identifying state changes of devices in a building, the method comprising: retrieving information from a device list indicating that a first device of the building is connected to a smart plug and that a second device of the building is not connected to the smart plug; establishing a network connection with the smart plug, wherein the smart plug provides power to one or more devices; receiving a smart-plug power monitoring signal via the network connection, wherein the smart-plug power monitoring signal indicates an amount of power provided over time by the smart plug to the one or more devices; obtaining a first-main power monitoring signal using measurements from a sensor that measures an electrical property of a first electrical main of a building; identifying a first-main power event in the first-main power monitoring signal, wherein the first-main power event corresponds to a state change of the second device; determining that the smart-plug power monitoring signal does not include a power event corresponding to the first-main power event; selecting a subset of power models from a plurality of power models, wherein selecting the subset comprises (i) excluding at least one power model corresponding to the first device and (ii) including at least one power model corresponding to the second device; processing the first-main power monitoring signal with the selected subset of power models to determine that the first-main power event corresponds to the state change of the second device; and updating an entry in the device list for the second device to indicate a current state of the second device.

Clause 2. The computer-implemented method of clause 1, wherein determining that the smart-plug power monitoring signal does not include a power event corresponding to the first-main power event comprises: determining that the smart-plug power monitoring signal indicates that it is not providing power to devices connected to the smart plug during a window of time around the first-main power event.

Clause 3. The computer-implemented method of clause 1, wherein determining that the smart-plug power monitoring signal does not include a power event corresponding to the first-main power event comprises: determining that the smart-plug power monitoring signal has a value of zero during a window of time around the first-main power event.

Clause 4. The computer-implemented method of clause 1, wherein determining that the smart-plug power monitoring signal does not include a power event corresponding to the first-main power event comprises: comparing the first-main power event to one or more power events in the smart-plug power monitoring signal.

Clause 5. The computer-implemented method of clause 4, wherein determining that the smart-plug power monitoring signal does not include a power event corresponding to the first-main power event comprises: computing a first feature vector comprising features of the first-main power event; computing a second feature vector comprising features of a power event in the smart-plug power monitoring signal; and comparing the first feature vector and the second feature vector.

Clause 6. The computer-implemented method of clause 1, wherein determining that the smart-plug power monitoring signal does not include a power event corresponding to the first-main power event comprises: computing a distance between a portion of the first-main power monitoring signal comprising the first-main power event and a portion of the smart-plug power monitoring signal.

Clause 7. The computer-implemented method of clause 1, wherein determining that the smart-plug power monitoring signal does not include a power event corresponding to the first-main power event comprises: determining a time difference between the first-main power event and a power event in the smart-plug power monitoring signal.

Clause 8. The computer-implemented method of clause 1, comprising: identifying a second first-main power event in the first-main power monitoring signal, wherein the second first-main power event corresponds to a state change of the first device; determining that the smart-plug power monitoring signal includes a power event corresponding to the second first-main power event; selecting a second subset of power models from the plurality of power models, wherein selecting the subset comprises (i) including at least one power model corresponding to the first device and (ii) excluding at least one power model corresponding to the second device; processing the first-main power monitoring signal with the selected subset of power models to determine that the power event corresponds to the state change of the first device; and updating an entry in the device list for the first device to indicate a current state of the first device.

It is possible, however, that the information in the device list is out of date and that the first device has been removed from the smart plug and has been plugged directly into an electrical outlet. Excluding the first power models entirely in processing the first-main power event may thus result in errors after the first device has been moved. In some implementations, weights may be used reduce the likelihood of errors instead of excluding power models entirely. Weights may be selected using any appropriate techniques. For example, where the smart plug indicates that it is not providing power to any connected devices, a weight of 1 may be used with the second device and a weight less than 1 may be used with the first device. The weights may be used to influence decisions instead of making hard decisions as described above. For example, a first weighted score may be computed by combining the first weight with a first score computed by a first power model for the first device (as described above) and a second weighted score may be computed by combining the second weight with a second score computed by a second power model for the second device. The weighted scores may then be used to select a device state change corresponding to a power event.

In some implementations, a first-main power event may be compared with a smart-plug power event to determine model weights. For example, a first-main power event may occur at an event time. This first-main power event may be compared with smart-plug power events that are close to the event time. Where the first-main power event is close to a smart plug event, power models for devices receiving power from the smart plug may be given higher weights and power models for devices not receiving power from the smart plug may be given lower weights. Conversely, where the first-main power event is not close to a smart plug event, power models for devices receiving power from the smart plug may be given lower weights and power models for devices not receiving power from the smart plug may be given higher weights. The weights may be computed, for example, using a distance between the first-main power event and the smart-plug power event. The weights may also be computed using a time difference between the first-main power event and the smart-plug power event.

Figure 8B:
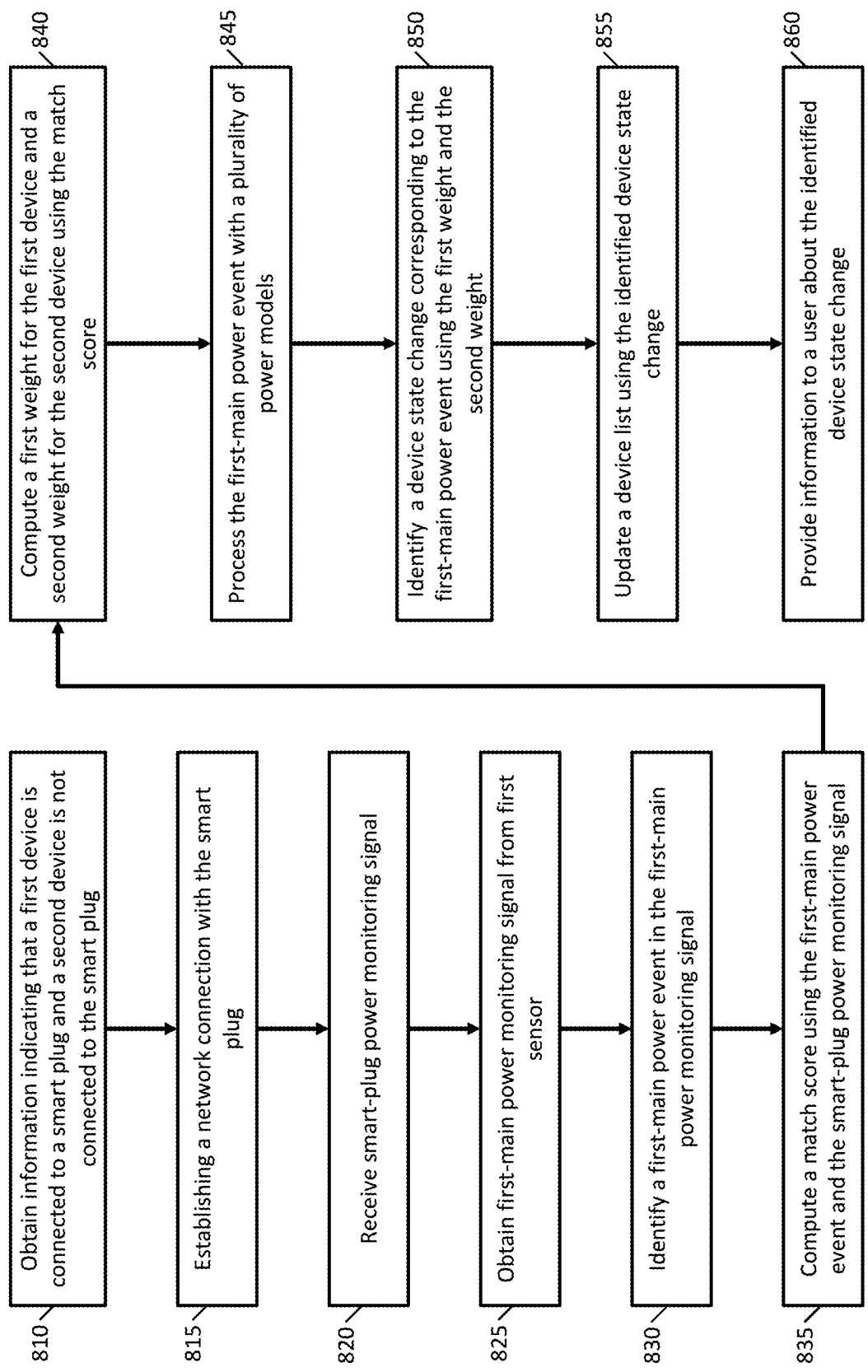

FIG. 8B is a flowchart of an example implementation of determining device state changes using a smart-plug power monitoring signal. Before performing the steps of FIG. 8B, it may be determined that the smart plug is receiving power from the first-main, such as by performing the steps of FIG. 6. It may also be determined that a first device is connected to the smart plug, such as by performing the steps of FIG. 7.

At step 810, information is obtained indicating that a first device is connected to a smart plug and that a second device is not connected to the smart plug. For example, the information may be obtained from a device list, such as any of the device lists described herein.

At step 815, a network connection is established between a power monitor and a smart plug; at step 820, the power monitor receives a smart-plug power monitoring signal from the smart plug; and at step 825, a first-main power monitoring signal is obtained using measurements of an electrical property of the first-main of the house by a first sensor. These steps may be performed using any of the techniques described above for steps 610, 615, and 620.

At step 830, a power event is identified in the first-main power monitoring signal. Any appropriate techniques may be used to identify a power event, such as any of the techniques described in U.S. Pat. No. 9,443,195.

At step 835, a match score is computed using the first-main power event and the smart-plug power monitoring signal where the match score indicates a similarity between the first-main power event and the smart-plug power monitoring signal. Any of the techniques described herein may be used to compute the match score. For example, the match score may be computed as a distance between a portion of the first-main power monitoring signal containing the power event and a portion of the smart-plug power monitoring signal. The match score may also be computed by comparing the first-main power event with a smart-plug power event in the smart-plug power monitoring signal (e.g., comparing changes in power caused by the power events).

At step 840, a first weight is computed for the first device and a second weight is computed for the second device using the match score and the information that the first device is connected to the smart plug and that the second device is not connected to the smart plug. Weights may also be computed for any other devices in the house. The weights may be computed using any appropriate techniques.

In some implementations, because the first device is connected to the smart plug, the first weight may be high where the match score is high (indicating a close match between the first-main power event and the smart-plug power monitoring signal) and the first weight may be low where the match score is low. For example, the first weight may be equal to the match score. Conversely, the second weight may be low when the match score is high, and the second weight may be high when the match score is low. For example, where the match score ranges between 0 and 1, the second score may be one minus the match score.

In some implementations, it may be determined that the smart-plug power monitoring signal is not providing any power during a time window around an event time of the first-main power event. Accordingly, the first weight may be set to zero since the first device is likely not consuming power and thus likely did not cause the first-main power event.

At step 845, the first-main power event is processed with power models where each model may correspond to a state change of a device. Each power model may output a score indicating a match between the first-main power event and the corresponding device state change. For example, the power models may include a first power model for a state change of the first device that outputs a first score, and a second power model for a state change of the second device that outputs a second score. Where a weight is zero, the processing for a power model may be skipped because a zero weight may indicate that a corresponding device is being excluded from consideration.

At step 850, a device state change is identified using the first weight and the second weight and the scores from step 845. For example, a first weighted score may be computed using the first score and the first weight (e.g., by multiplying them or any other appropriate combination) and a second weighted score may be computed using the second score and the second weight. A device state change may then be selected using the weighted scores, such as by selecting a device state change corresponding to a highest weighted score. For example, where the first weighted score is highest, the state change of the first device may be selected, and where the second weighted score is highest, the state change of the second device may be selected.

At step 855, a device list is updated using the identified device state change at step 850. A device list may be stored in any appropriate data store.

At step 860, information about the device state change identified at step 850 may be provided to a user, such as using any of the techniques described herein or in U.S. Pat. No. 9,443,195. In some implementations, step 860 may not be performed, and the user may not be informed about the device state change.

In some implementations, device state changes may be identified as described in the following clauses and combinations of any two or more of them.

Clause 1. A computer-implemented method for identifying state changes of devices in a building, the method comprising: retrieving information from a device list indicating that a first device of the building is connected to a smart plug and that a second device of the building is not connected to the smart plug; establishing a network connection with the smart plug, wherein the smart plug provides power to one or more devices; receiving a smart-plug power monitoring signal via the network connection, wherein the smart-plug power monitoring signal indicates an amount of power provided over time by the smart plug to the one or more devices; obtaining a first-main power monitoring signal using measurements from a sensor that measures an electrical property of a first electrical main of a building; identifying a first-main power event in the first-main power monitoring signal, wherein the first-main power event corresponds to a state change of the first device; computing a match score using the first-main power event and the smart-plug power monitoring signal; computing, using the match score, a first weight for a first power model for the first device and a second weight for a second power model for the second device, wherein the first weight is larger than the second weight; processing the first-main power event with the first power model, the first weight, the second power model, and the second weight to determine that the first-main power event corresponds to the state change of the first device; and updating an entry in the device list for the first device to indicate a current state of the first device.

Clause 2. The computer-implemented method of clause 1, wherein computing the match score comprises: identifying a smart-plug power event in the smart-plug power monitoring signal; and comparing the first-main power event and the smart-plug power event.

Clause 3. The computer-implemented method of clause 1, wherein computing a match score comprises computing a distance between a portion of the first-main power monitoring signal comprising the first-main power event and a portion of the smart-plug power monitoring signal.

Clause 4. The computer-implemented method of clause 1, wherein computing the match score comprises using a difference in time between the first-main power event and a smart-plug power event in the smart-plug power monitoring signal.

Clause 5. The computer-implemented method of clause 1, wherein the first weight is one and the second weight is zero.

Clause 6. The computer-implemented method of clause 1, wherein processing the first-main power event with the first power model, the first weight, the second power model, and the second weight to determine that the first-main power event corresponds to the state change of the first device comprises: processing the first-main power event with the first power model to produce a first score; computing a first weighted score using the first score and the first weight; processing the first-main power event with the second power model to produce a second score; computing a second weighted score using the second score and the second weight; and determining that the first-main power event corresponds to the state change of the first device using the first weighted score and the second weighted score.

Clause 7. The computer-implemented method of clause 1, comprising: identifying a second first-main power event in the first-main power monitoring signal, wherein the second first-main power event corresponds to a state change of the second device; computing a second match score using the second first-main power event and the smart-plug power monitoring signal; computing, using the second match score, a third weight for the first power model for the first device and a fourth weight for the second power model for the second device, wherein the fourth weight is larger than the third weight; processing the second first-main power event with the first power model, the third weight, the second power model, and the fourth weight to determine that the second first-main power event corresponds to the state change of the second device; and updating an entry in the device list for the second device to indicate a current state of the second device.

Training Models Using a Smart Plug

A smart plug may assist in training mathematical models for devices. To train mathematical models for a device, a training corpus of power monitoring signals may be obtained that includes examples of the device changing states (e.g., turning on and turning off). For some devices, it may be relatively easy to collect a sufficient amount of training data to train models for the devices. For example, the devices may change state relatively frequently or have power events that are relatively easy to identify in a main power monitoring signal (e.g., because of large power changes or distinctive signatures in state transitions).

For some devices, however, it may be more challenging to collect a sufficient amount of training data to train models. For example, the device may change state relatively infrequently, the power changes of state transitions may be relatively small, or the signatures of state changes may be similar to state changes of other devices. A smart plug may facilitate the collection of training data for such devices.

A user may intentionally connect a device to a smart plug for the purpose of training a model for the device. For example, after connecting the device to the smart plug, the user may submit a request to a company providing the power monitoring services to train a model for the device. Alternatively, a user may connect a device to a smart plug for other reasons, and a power monitor may determine that mathematical models are not available for the device connected to the smart plug, and the power monitor may proceed to collect data from the smart plug for the purpose of training mathematical models for the device.

The power models that may be trained for a device include any of the mathematical models described in U.S. Pat. No. 9,443,195, such as transition models, device models (referred to herein as state models), and wattage models.

Figure 9:
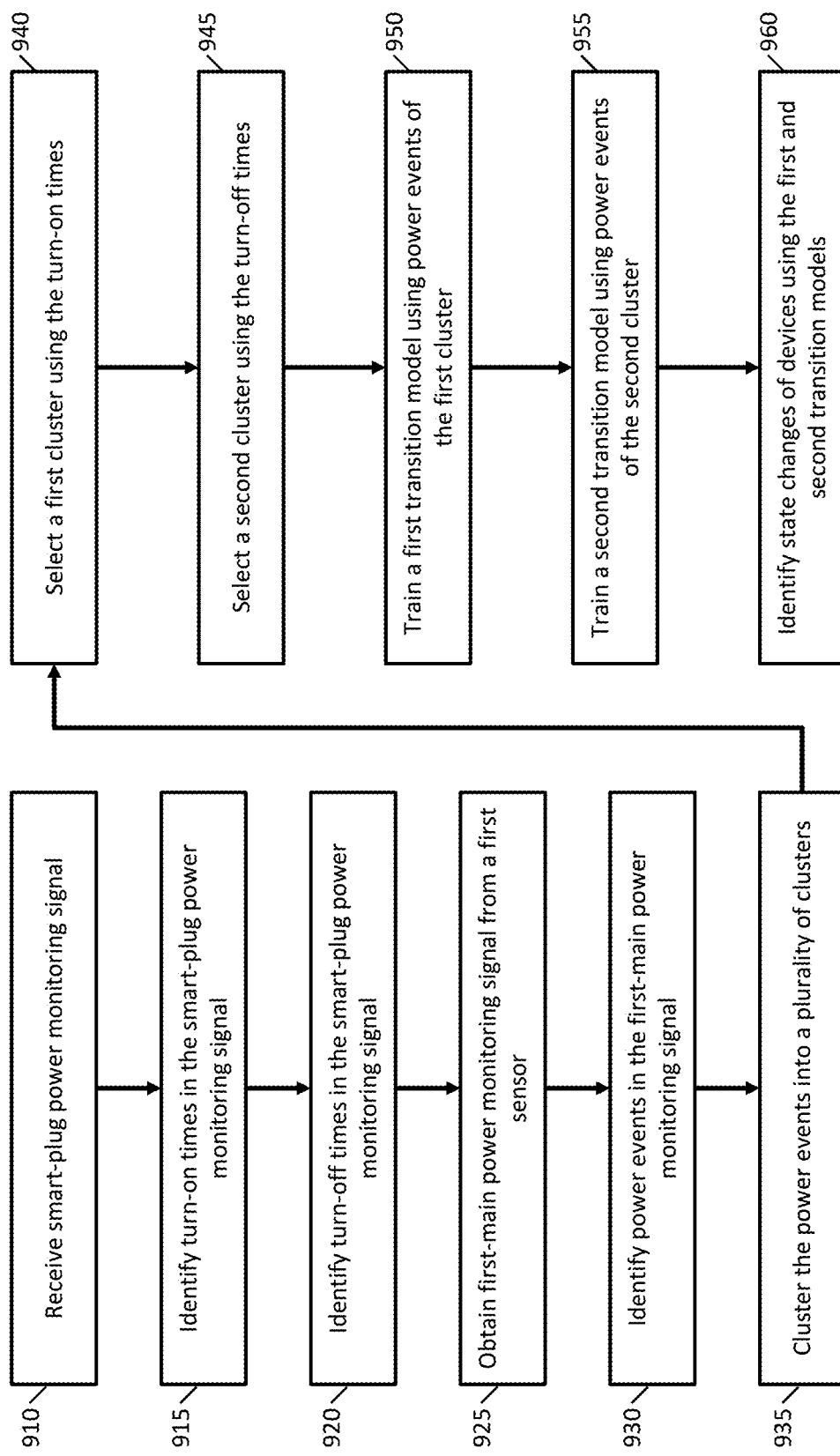
FIG. 9 is a flowchart of an example implementation of training transition models for a device using a smart-plug power monitoring signal.

FIG. 9 is a flowchart of an example implementation of training mathematical models for a device using a smart-plug power monitoring signal. At step 910, a power monitor receives a smart-plug power monitoring signal from a smart plug. This step may be performed using any of the techniques described above for step 615. For example, prior to receiving the smart-plug power monitoring signal from the smart plug, a network connection may be established between the power monitor and the smart plug.

At step 915, turn-on times are determined by processing the smart-plug power monitoring signal. For example, a turn-on time may be determined as a time corresponding to a transition from zero power to non-zero power in the smart-plug power monitoring signal. Appropriate thresholds may be used, as described above, so that zero power may correspond to an amount of power below a threshold and need not be precisely zero. The turn-on times may be identified by processing the smart-plug power monitoring signal over a period of time, such as a day, a week, or a month. The turn-on times may all correspond to a first device turning on or may correspond to multiple devices turning on (e.g., where multiple devices are connected to the smart plug).

At step 920, turn-off times are determined by processing the smart-plug power monitoring signal. For example, a turn-off time may be determined as a time corresponding to a transition from non-zero power to zero power in the smart-plug power monitoring signal (e.g., using appropriate thresholds). The turn-off times may be identified by processing the smart-plug power monitoring signal over a period of time, such as a day, a week, or a month. The turn-off times may all correspond to a first device turning off or may correspond to multiple devices turning off (e.g., where multiple devices are connected to the smart plug).

At step 925, a first-main power monitoring signal is obtained. This step may be performed using any of the techniques described above for step 620. In some implementations, a first-main power monitoring signal may be selected from among other power monitoring signals (e.g., a second-main power monitoring signal) where it has been previously determined that the smart plug receives power from the first-main, such as by using techniques described herein.

At step 930, power events are identified in the first-main power monitoring signal. A power event may indicate that a device (which may or may not receive power from the smart plug) changed state, such as turning on or off. A power event may be identified using any appropriate techniques, such as any techniques described herein or in U.S. Pat. No. 9,443,195. Each power event may be associate with an event time, and an event time may be stored for each power event. The power events may be identified by processing the first-main power monitoring signal over a period of time, such as a day, a week, or a month.

At step 935, the power events are clustered into a plurality of clusters. Any appropriate techniques may be used to cluster the power events, such as by computing features from the power events and then clustering using the features. Any appropriate features may be used, such as a match between the power event and a template, Fourier coefficients, neural network features, or a change in power, current, voltage, or phase before and after the power event. Any appropriate clustering techniques may be used, such as k-means clustering, hierarchical clustering, centroid-based clustering, or density-based clustering.

The clustering of the power events may result in similar power events being in the same cluster and non-similar power events being in different clusters. For example, all turn-on power events for a particular device may be in the same cluster. In some instances, a cluster may include only a specific power event for a specific device, such as power events for the toaster oven turning on. In some instances, a cluster may include power events from more than one device, such as power events for the toaster oven turning on and power events for a curling iron turning on.

At step 940, a first cluster of the plurality of clusters is selected using the turn-on times and the event times of power events in the first cluster. Any appropriate techniques may be used to select the first cluster. For example, the event times of the power events of the first cluster may be compared to the turn-on times. In some implementations, a score may be computed for each cluster of the plurality of clusters that indicates a match between the event times of the power events of the cluster and the turn-on times, and a cluster having a highest score may be selected. For example, a score for a cluster may be a fraction or percentage of power events in the cluster that are within a time window of a turn-on time, such as with 5 seconds of a turn-on time. Where many event times of cluster are close to turn-on times, it may be more likely that the cluster corresponds to a device connected to the smart plug turning on.

At step 945, a second cluster of the plurality of clusters is selected using the turn-off times and the event times of power events in the second cluster. Any appropriate techniques may be used to select the second cluster, such as the techniques described at step 940.

At step 950, a first transition model is trained using one or more of the power events of the first cluster. Any appropriate transition model may be trained using any appropriate techniques, such as any transition models or techniques described herein or in U.S. Pat. No. 9,443,195. In some implementations, a subset of the power events in the first cluster may be used to train the first transition model. For example, only power events that are within a time window of a turn-on time may be used to train the first transition model.

At step 955, a second transition model is trained using one or more of the power events of the second cluster. Any appropriate techniques may be used to train the second transition model, such as the techniques described at step 950.

At step 960, the first and second transition models are used to identify state changes of devices. For example, the first and second transition models may be deployed to a power monitor in the same building from which the smart plug and first-main power monitoring signals were obtained. The first and second transition models may be used to identify state changes (e.g., turning on and off) of a device that is connected to the smart plug or to a device that is not (or no longer) connected to the smart plug.

In some implementations, the first and second transition models may be used in a building different from the building from which the smart plug and first-main power monitoring signals were obtained. For example, the first and second transition models may have been trained from power events corresponding to a toaster oven turning on and off in a first building, and the first and second transition models may be used in a second building to identify power events from a toaster oven turning on or off.

For some devices, it may be desired to train more than two transition models. For a device like a light bulb with only two states (on and off), two transition models may be sufficient. A first transition model may describe a transition from the off state to the on state, and a second transition model may describe a transition from the on state to the off state. By comparison, an air conditioner, may have a first state that is an off state, a second state where a condenser motor is operating and a blower motor is not operating, and a third state where both the condenser motor and the blower motor are operating. It may be desired to have a first transition model for the air conditioner transitioning from the first state (the off state) to the second state (only condenser motor operating), a second transition model for transitioning from the second state to the third state (blower motor turning on in addition to the condenser motor), and a third transition model for transition from the third state back to the first state. For other devices, additional device states and transition models may be desired.

Figure 10:
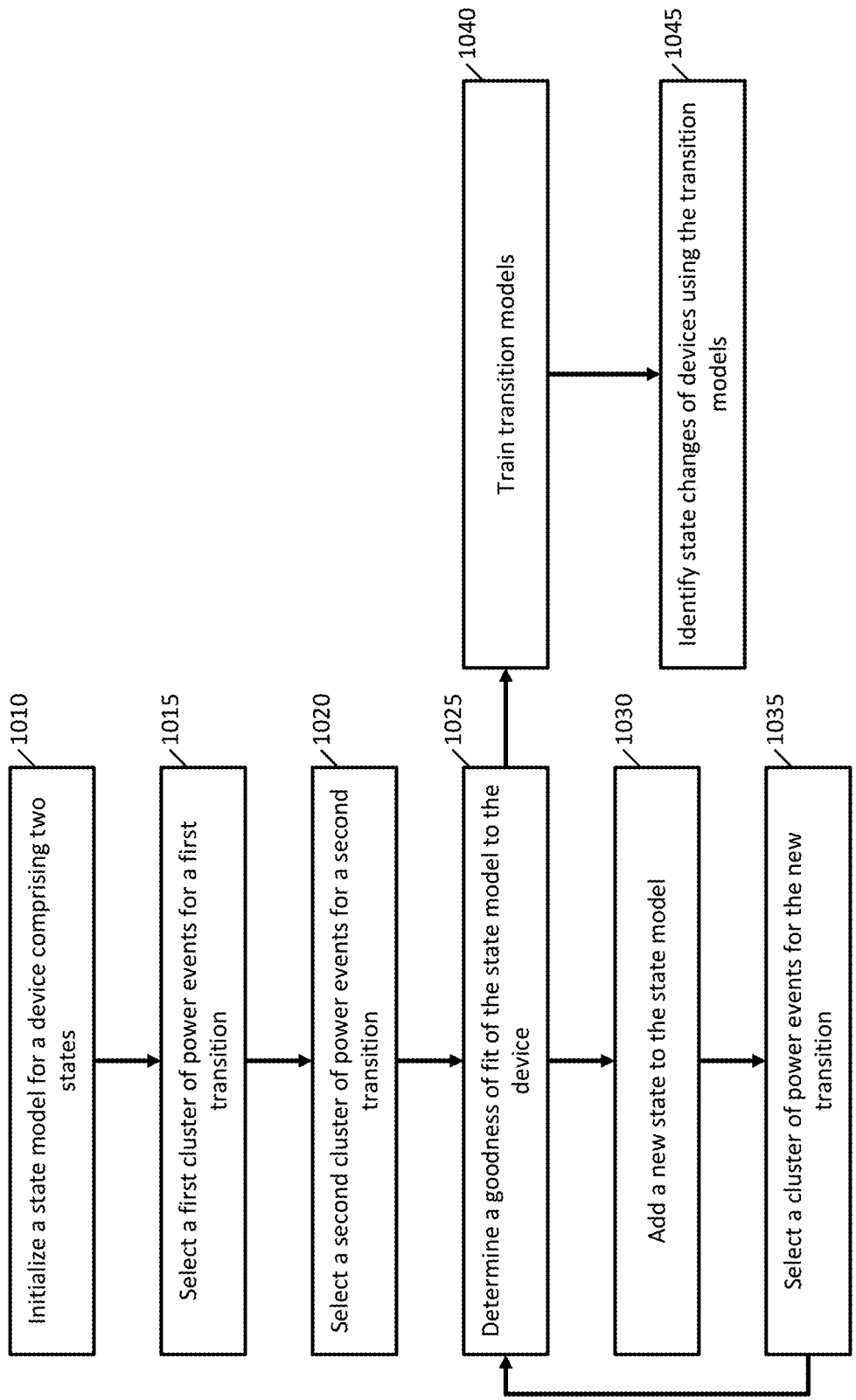
FIG. 10 is a flowchart of an example implementation of training transition models for a device with three or more states using a smart-plug power monitoring signal.

FIG. 10 is a flowchart of an example implementation of training more than two mathematical models for a device using a smart-plug power monitoring signal. The processing of FIG. 10 may be used, for example, in conjunction with the processing of FIG. 9.

Figure 11B:
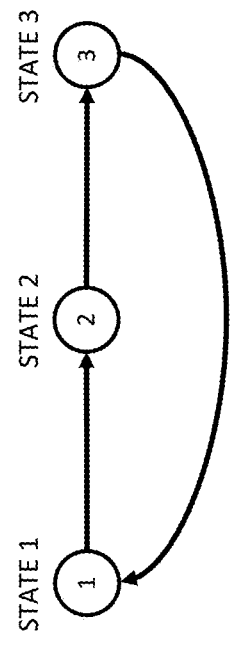
FIGS. 11A and 11B are example state models for a device.
Figure 11A:
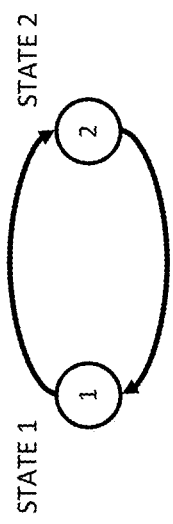

At step 1010, a state model is initialized for a device that receives power from the smart plug where the state model has two states. For example, the first state may correspond to the device being off and the second state may correspond to the device being on. The state model may include a first transition from the first state to the second state and a second transition from the second state to the first state. FIG. 11A illustrates an example state model with two states where, for example, state 1 may be an off state and state 2 may be an on state.

At step 1015, a first cluster of power events is selected for the first transition, and at step 1020, a second cluster of power events is selected for the second transition. Steps 1015 and 1020 may use any of the techniques described herein, such as any of the techniques of FIG. 9. For example, turn-on times and turn-off times may be identified in a power monitoring signal, power events may be identified in a first-main power monitoring signal, the power events may be clustered into a plurality of clusters, and the first and second clusters may be selected using the turn-on times, the turn-off times, and the event times of power events.

Figure 12B:
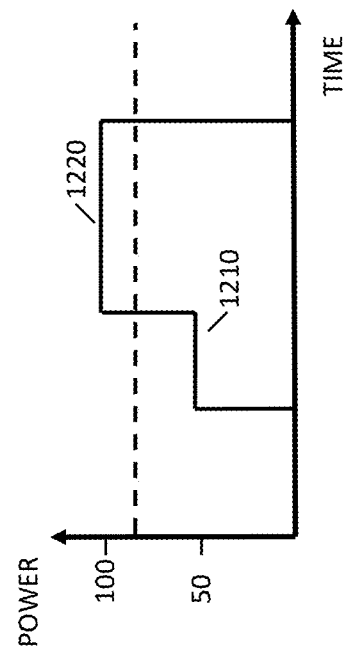
FIGS. 12A and 12B are example power monitoring signals for a device.
Figure 12A:
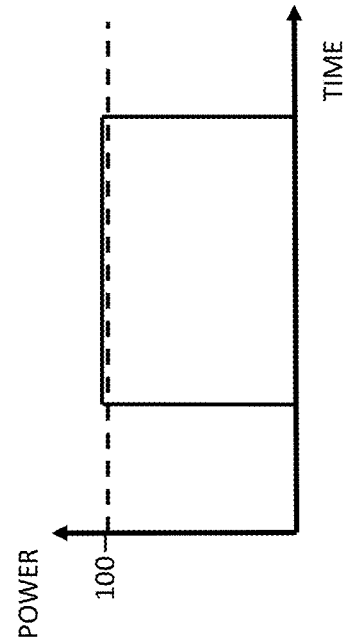

At step 1025, a goodness of fit is determined between the state model and the device being modeled. Any appropriate techniques may be used to determine the goodness of fit.

Where a device has only two states (e.g., on and off), the device may consume zero power when it is off and a relatively constant amount of power when it is on. A first transition may be from zero power to a typical power usage for the device. The device may continue to consume the typical power usage until the second transition from the typical power usage to zero power. FIG. 12A illustrates an example of a power monitoring signal for a device with two states where the device consumes 0 watts when it is off and 100 watts when it is on. A state model with two states may be a good fit for the device of FIG. 12A.

When a device has more than two states, the amount of power consumed by the device over time may change while it is on. A first transition may be from zero power to a first typical power usage for the device (e.g., a condenser motor). The device may continue to consume the typical power usage until a second transition from the first typical power usage to a second typical power usage (e.g., both a condenser motor and a blower motor). A third transition may be back to zero power. FIG. 12B illustrates an example of power monitoring signal for a device with three states where the device consumes 0 watts when it is off, consumes 50 watts after it is turned on, and consumes 100 watts at a later time. A state model with two states may not be a good fit for the device of FIG. 12B.

A goodness of fit may be determined, for example, by creating a wattage model for the device. Any appropriate wattage model may be used, such as any wattage models described herein or in U.S. Pat. No. 9,443,195. A wattage model may be created by computing an expected change in power consumption corresponding to a transition from a first state to a second state.

Any appropriate techniques may be used to determine an expected change in power consumption corresponding to a transition, and the expected change may be computed from one or both of the smart-plug power monitoring signal and the first-main power monitoring signal. For each power event corresponding to a transition, an amount of power may be determined for both before and after the power event. The amount of power may be, for example, an amount of power at a specific time (e.g., 2 seconds before and after the power event) or an average of power consumption over a time window (e.g., a window from 1-3 seconds before and after the power event). A power change may be determined for each power event by computing a change in power before and after the power event.

An expected change in power consumption for a transition may be computed from the power changes of the power events corresponding to the transition. Any appropriate techniques may be used, such as computing a statistic of the power changes of the power events. For example, the statistic may be a mean or median of the power changes of the power events (and outliers may be excluded).

A wattage model for a device may be that the device consumes a relatively constant amount of power while the device is in a particular state, and the expected amount of power may correspond to a power change of a transition to the particular state.

A goodness of fit of the state model may be determined by comparing the wattage model to the actual power consumption indicated by the power monitoring signal. For example, a wattage model for the device of FIG. 12A may indicate that the device is expected to consume 99 watts while the device is on (as indicated by the dashed line). In the power monitoring signal of FIG. 12A, the device is actually consuming 100 watts so the wattage model is close to the power monitoring signal and state model a good fit to the power monitoring signal. By contrast, a wattage model for the device of FIG. 12B may indicate that the device is expected to consume 90 watts while the device is on (as indicated by the dashed line). In the power monitoring signal of FIG. 12B, the device is actually consuming 50 watts or 100 watts so the state model is not a good fit to the power monitoring signal.

The goodness of fit between a state model and a particular power monitoring signal may be computed using any appropriate techniques. For example, a distance between a wattage model and a particular power monitoring signal may be computed by sampling the power monitoring signal at a sequence of intervals and computing a sum of squares of the differences between the samples and the expected amount of power indicated by the wattage model.

A smart-plug power monitoring signal may have multiple examples of the device turning on and off, and a goodness of fit may be computed for each example of the device turning on and off. A goodness of fit of the state model to the device may be computed by combining the goodness of fit of the state model to each example in the smart-plug power monitoring signal. For example, the goodness of fit of the state model to the device may be a mean or median of the goodness of fit values computed for each example of the device being in an on state in the smart-plug power monitoring signal (and outliers may be excluded).

The goodness of fit may be used to decide whether to add another state to the state model. For example, the goodness of fit may be compared to a threshold. Where the goodness of fit computed at step 1025 is not sufficient, processing may proceed to step 1030.

At step 1030, a new state is added to the state model. For example, FIG. 11B illustrates a state model where a third state has been inserted after the second state of FIG. 11A. For example, state 1 may still correspond to an off state, state 2 may correspond to a first operating state (e.g., only the condenser motor is operating), and state 3 may correspond to a second operating state (e.g., both the condenser and blower motors are operating). Accordingly, the transition from state 1 to state 2 may correspond to the device turning on, the transition from state 2 to state 3 may corresponding to a change in operation while the device is on, and the transition from state 3 to state 1 may correspond to the device turning off. In this example, the state model includes only the three transitions indicated in FIG. 11B, but in some implementations, additional transitions may be included, such as adding transitions between each pair of states.

After adding the third state, the first cluster of power events may be assigned to the transition from state 1 to state 2 (the device turning on) and the second cluster of power events may be assigned to the transition from state 3 to state 1 (the device turning off).

At step 1035, a cluster of power events is selected for the transition to the new state (e.g., a change from state 2 to state 3 in FIG. 11B). Because the transition to the new state occurs while the device is already on, the transition should generally occur between a turn-on time and a subsequent turn-off time. Accordingly, the third cluster may be selected by comparing event times of the power events of the selected cluster with times where the device connected to the smart plug is in an on state (e.g., between a turn-on time and a subsequent turn-off time obtained from the smart-plug power monitoring signal). In some implementations, a score may be computed for each cluster of the plurality of clusters that indicates a match between the event times of the power events of the cluster and times between a turn-on time and a subsequent turn-off time. A cluster having a highest score may then be selected. For example, a score for a cluster may be a fraction or percentage of power events in the cluster that are between a turn-on time and a subsequent turn-off time. Where many event times of cluster are in this range, it may be more likely that the cluster corresponds to the transition to the new state.

After step 1035, processing may return to step 1025 to determine a goodness of fit of the state model (now with three states) to the device. Since the state model now has two operating states (states 2 and 3), a wattage model may be computed for each operating state, and the wattage models may each be compared with a portion of the smart-plug power monitoring signal. For example, the wattage model for state 2 may be compared with portion 1210 of FIG. 12B and the wattage model for state 3 may be compared with portion 1220. Portions 1210 and 1220 may be identified from the power monitoring signal using any appropriate techniques, such as by identifying the portions using power events or selecting portions that provide a best fit to the wattage models. Where the goodness of fit is still not sufficient, processing may again proceed to step 1030 to add another state to the model. Where the goodness of fit is sufficient, processing may proceed to step 1040.

At step 1040, transition models are trained for each selected cluster, and at step 1045, the transition models are used to identify state changes of devices. Steps 1040 and 1045 may use any of the techniques described herein, such as any of the techniques of FIG. 9.

In some implementations, a state model may be initialized with more than two states instead of initializing the state model with two states as described above. Any appropriate techniques may be used to determine an initial number of states.

In some implementations, an initial number of states may be determined by looking for transitions in examples of the smart-plug power monitoring signal. For example, portions of the smart-plug power monitoring signal may be obtained where each portion begins near a transition from zero power to non-zero power (a device turning on) and ends near a subsequent transition from non-zero power to zero power (a device turning off). For each portion of the smart-plug power monitoring signal, power events between the device turning on and off may be identified (internal power events), using any techniques described herein. For each portion, the number of states in the portion may be determined to be two more than the number of internal power events. For example, with no internal power events, the number of states of the portion may be two (on and off), and with one internal power event, the number of states may be three. The numbers of states for the portions of the smart-plug power monitoring signals may be combined to determine an initial number of states for the state model. For example, the initial number of states may be a statistic (e.g., mean or median) or a maximum or minimum of the states for the portions.

In some implementations, an initial number of states may be determined using the times of power events in the clusters. For example, a first cluster may be selected using turn-on times as described at step 940, and a second cluster may be selected using turn-off times as described at step 945. For each of the other clusters, it may be determined how often the power events of the clusters are between a turn-on time and a subsequent turn-off time. Where a percentage or fraction of power events in a cluster that are between a turn-on time and a subsequent turn-off time is high (e.g., exceeding a threshold), it may be determined that the cluster likely corresponds to a state change of a device while the device is on and that the device has more than one operating state (in addition to an on state). The initial number of states for the state model may be determined to be two more than the number of clusters that likely correspond to a state change of a device while the device is on. For example, where no clusters likely correspond to a state change of a device while the device is on, the initial number of states may be two (on and off), and where one cluster likely corresponds to a state change of a device while the device is on, the initial number of states may be three.

After determining an initial number of states, where the number of initial states is more than two (e.g., there is more than one operating state), the processing of FIG. 9 may be adapted to train additional transition models. As in FIG. 9, a first transition model may be trained using a cluster corresponding to the turn-on times, and a second transition model may be trained using a cluster corresponding to the turn-off times. For each state in addition to two states, a cluster may be selected using the event times of the clusters (e.g., by comparing the event times to the turn-on and turn-off times), and a transition model may be trained using the power events of the selected cluster. In some implementations, the processing of FIG. 10 may be used to determine to add additional states, and the number of states may be increased beyond the initial number of states.

In some implementations, it may be determined that the initial number of states was too high, and the number of states may be decreased. For example, when selecting a cluster, it may be determined that there is no suitable cluster for a state transition (e.g., based on comparing the event times of the available clusters to the turn-on and turn-off times), and as a result, the number of states may be reduced.

In some implementations, transition models may be trained as described in the following clauses and combinations of any two or more of them.

Implementation

Variations of the techniques described above are possible. Although the techniques described above reference a single smart plug, the techniques may be adapted to use with more than one smart plug in a building. For example, a power monitor may establish network connections with two or more smart plugs, receive a smart-plug power monitoring signal from each of the smart plugs, and perform any of the techniques described above for each smart-plug power monitoring signal.

Any of the techniques described above may also be implemented with a smart circuit breaker instead of a smart plug. A smart circuit breaker may provide information about power consumption for devices that receive power from the circuit breaker. A smart circuit breaker, for example, may be installed into an electrical panel and provide power to one or more devices via the electrical circuit that is connected to the smart circuit breaker. A smart circuit breaker can include functionality to provide information about the power provided to the devices that receive power from the smart circuit breaker. For example, the smart circuit breaker may include one or more sensors that measure electrical properties (e.g., current, voltage, or power) of the electricity provided to the circuit. The sensor data may be used to determine an amount of power consumed by the devices connected to the circuit over time. The smart circuit breaker may also have a network connection (e.g., Wi-Fi or Bluetooth) to transmit information about the power usage of the connected device to other devices, such as a smart phone. A smart circuit breaker may have other functionality as well. For example, a smart circuit breaker may have an electrical relay to start and stop the flow of electricity to the circuit, and a user may have an application (or "app") on a smart phone that allows a user to control the relay.

As used herein, a smart circuit breaker is a device that receives electrical power from a main of a building (e.g., via first-main bus bar 211 of FIG. 2), provides power to a circuit, has a sensor to measure information about power transmitted to the one or more devices connected to the circuit, and has a network connection (wired or wireless) to transmit information about the measured power consumption to other devices, such as a power monitor. A smart circuit breaker may also provide other functionality, such as allowing a user to effectively disconnect power to the circuit by opening a relay in the smart circuit breaker.

A power monitor may establish a network connection with a smart circuit breaker (or multiple smart circuit breakers) and receive a smart-circuit-breaker power monitoring signal from the smart circuit breaker. Where the power monitor is installed near the smart circuit breaker (e.g., in or near an electrical panel), the power monitor may receive sensor data directly from the smart circuit breaker, and a network connection may not be needed.

A smart-circuit-breaker power monitoring signal may be processed using any of the techniques described above for a smart-plug power monitoring signal. Because a smart circuit breaker provides power to a circuit (as compared to a smart plug that provides power to one or more devices connected to it), a smart-circuit-breaker power monitoring signal may indicate power consumption of a larger number of devices than a smart-plug power monitoring signal. Extending the techniques described above to a smart-circuit-breaker power monitoring signal is straightforward to one of skill in the art.

Figure 13:
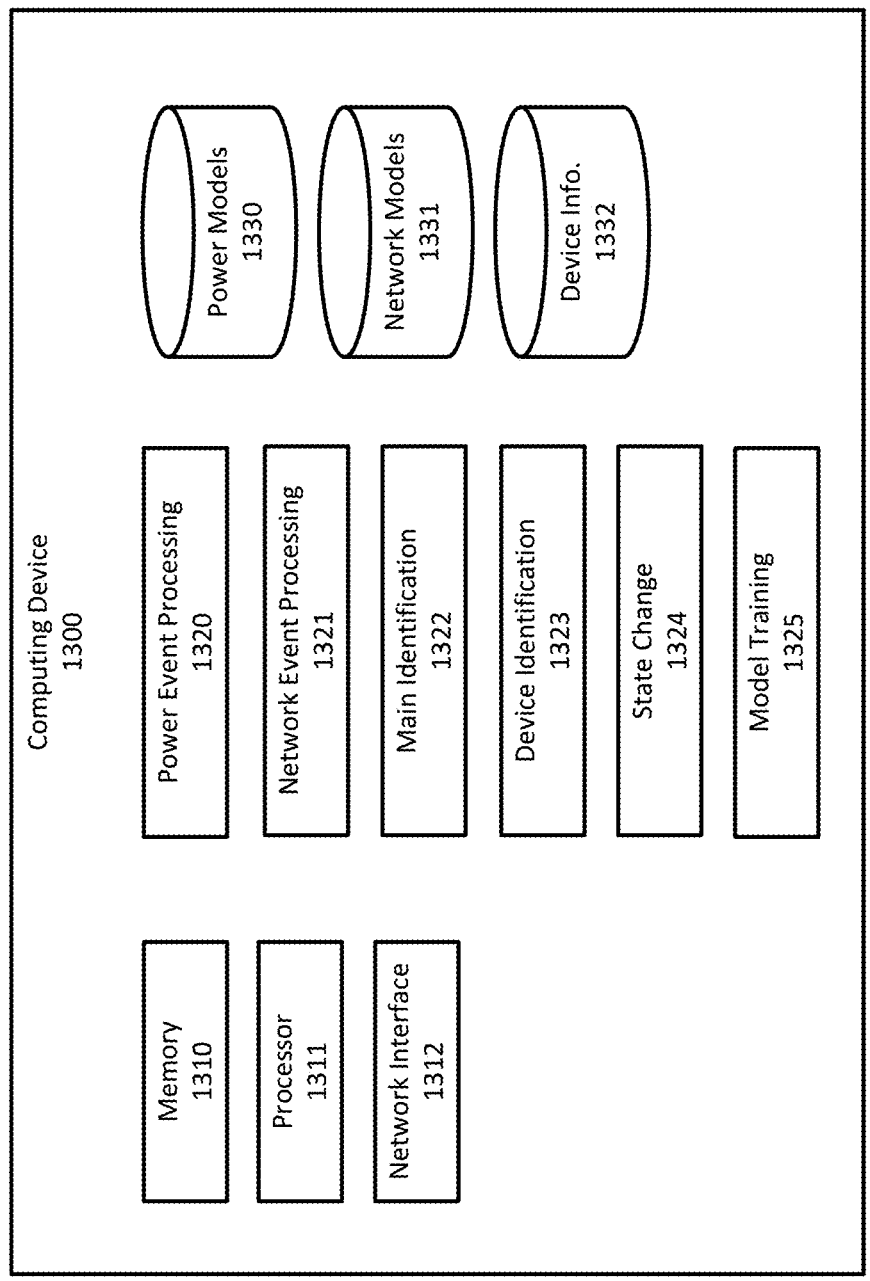
FIG. 13 is an example of a device for processing a smart-plug power monitoring signal.

FIG. 13 illustrates components of some implementations of a computing device 1300 that may be used for any of a power monitor or a server that operates in conjunction with a power monitor. In FIG. 13, the components are shown as being on a single computing device, but the components may be distributed among multiple computing devices, such as among any of the devices mentioned above or among several server computing devices.

Computing device 1300 may include any components typical of a computing device, such as one or more processors 1311, volatile or non-volatile memory 1310, and one or more network interfaces 1312 for connecting to computer networks. Computing device 1300 may also include any input and output components, such as displays, keyboards, and touch screens. Computing device 1300 may also include a variety of components or modules providing specific functionality, and these components or modules may be implemented in software, hardware, or a combination thereof. Below, several examples of components are described for one example implementation, and other implementations may include additional components or exclude some of the components described below.

Computing device 1300 may include a power event processing component 1320 that may be used to process power monitoring signals and determine information about devices from the power monitoring signals, such as identifying devices and device state changes. Computing device 1300 may include a network event processing component 1321 that may be used to process data from a computer network and determine information about devices from the network data, such as identifying devices and device state changes. Computing device 1300 may include a main identification component 1322 that may be used to identify a main from which a smart plug is receiving power. Computing device 1300 may include a device identification component 1323 that may be used to identify a device that is receiving power from a smart plug. Computing device 1300 may have a state change component 1324 that may be used to determine a device state change corresponding to a power event using a main power monitoring signal and a smart-plug power monitoring signal. Computing device 1300 may have a model training component 1325 that may be used to train mathematical models for a device using a main power monitoring signal and a smart-plug power monitoring signal.

Computing device 1300 may include or have access to various data stores, such as data stores 1330, 1331, and 1332. Data stores may use any known storage technology such as files, relational databases, non-relational databases, or any non-transitory computer-readable media. For example, computing device 1300 may have a power models data store 1330 to store power models or information about power models. Computing device 1300 may have a network models data store 1331 to store network models or information about network models. Computing device 1300 may have a device information data store 1332 that may be used to store information about devices, such as device lists for one or more buildings.

While only a few embodiments of the present invention have been shown and described, it will be obvious to those skilled in the art that many changes and modifications may be made thereunto without departing from the spirit and scope of the present disclosure as described in the following claims. All patent applications and patents, both foreign and domestic, and all other publications referenced herein are incorporated herein in their entireties to the full extent permitted by law.

The methods and systems described herein may be deployed in part or in whole through a machine that executes computer software, program codes, and/or instructions on a processor. The processor may be part of a server, cloud server, client, network infrastructure, mobile computing platform, stationary computing platform, or other computing platform. A processor may be any kind of computational or processing device capable of executing program instructions, codes, binary instructions and the like. The processor may be or include a signal processor, digital processor, embedded processor, microprocessor or any variant such as a co-processor (math co-processor, graphic co-processor, communication co-processor and the like) and the like that may directly or indirectly facilitate execution of program code or program instructions stored thereon. In addition, the processor may enable execution of multiple programs, threads, and codes. The threads may be executed simultaneously to enhance the performance of the processor and to facilitate simultaneous operations of the application. By way of implementation, methods, program codes, program instructions and the like described herein may be implemented in one or more thread. The thread may spawn other threads that may have assigned priorities associated with them; the processor may execute these threads based on priority or any other order based on instructions provided in the program code. The processor may include memory that stores methods, codes, instructions and programs as described herein and elsewhere. The processor may access a storage medium through an interface that may store methods, codes, and instructions as described herein and elsewhere. The storage medium associated with the processor for storing methods, programs, codes, program instructions or other type of instructions capable of being executed by the computing or processing device may include but may not be limited to one or more of a CD-ROM, DVD, memory, hard disk, flash drive, RAM, ROM, cache and the like.

A processor may include one or more cores that may enhance speed and performance of a multiprocessor. In embodiments, the process may be a dual core processor, quad core processors, other chip-level multiprocessor and the like that combine two or more independent cores (called a die).

The methods and systems described herein may be deployed in part or in whole through a machine that executes computer software on a server, cloud server, client, firewall, gateway, hub, router, or other such computer and/or networking hardware. The software program may be associated with a server that may include a file server, print server, domain server, internet server, intranet server and other variants such as secondary server, host server, distributed server and the like. The server may include one or more of memories, processors, computer readable media, storage media, ports (physical and virtual), communication devices, and interfaces capable of accessing other servers, clients, machines, and devices through a wired or a wireless medium, and the like. The methods, programs or codes as described herein and elsewhere may be executed by the server. In addition, other devices required for execution of methods as described in this application may be considered as a part of the infrastructure associated with the server.

The server may provide an interface to other devices including, without limitation, clients, other servers, printers, database servers, print servers, file servers, communication servers, distributed servers and the like. Additionally, this coupling and/or connection may facilitate remote execution of program across the network. The networking of some or all of these devices may facilitate parallel processing of a program or method at one or more location without deviating from the scope of the disclosure. In addition, any of the devices attached to the server through an interface may include at least one storage medium capable of storing methods, programs, code and/or instructions. A central repository may provide program instructions to be executed on different devices. In this implementation, the remote repository may act as a storage medium for program code, instructions, and programs.

The software program may be associated with a client that may include a file client, print client, domain client, internet client, intranet client and other variants such as secondary client, host client, distributed client and the like. The client may include one or more of memories, processors, computer readable media, storage media, ports (physical and virtual), communication devices, and interfaces capable of accessing other clients, servers, machines, and devices through a wired or a wireless medium, and the like. The methods, programs or codes as described herein and elsewhere may be executed by the client. In addition, other devices required for execution of methods as described in this application may be considered as a part of the infrastructure associated with the client.

The client may provide an interface to other devices including, without limitation, servers, other clients, printers, database servers, print servers, file servers, communication servers, distributed servers and the like. Additionally, this coupling and/or connection may facilitate remote execution of program across the network. The networking of some or all of these devices may facilitate parallel processing of a program or method at one or more location without deviating from the scope of the disclosure. In addition, any of the devices attached to the client through an interface may include at least one storage medium capable of storing methods, programs, applications, code and/or instructions. A central repository may provide program instructions to be executed on different devices. In this implementation, the remote repository may act as a storage medium for program code, instructions, and programs.

The methods and systems described herein may be deployed in part or in whole through network infrastructures. The network infrastructure may include elements such as computing devices, servers, routers, hubs, firewalls, clients, personal computers, communication devices, routing devices and other active and passive devices, modules and/or components as known in the art. The computing and/or non-computing device(s) associated with the network infrastructure may include, apart from other components, a storage medium such as flash memory, buffer, stack, RAM, ROM and the like. The processes, methods, program codes, instructions described herein and elsewhere may be executed by one or more of the network infrastructural elements.

The methods, program codes, and instructions described herein and elsewhere may be implemented on a cellular network having multiple cells. The cellular network may either be frequency division multiple access (FDMA) network or code division multiple access (CDMA) network. The cellular network may include mobile devices, cell sites, base stations, repeaters, antennas, towers, and the like. The cell network may be a GSM, GPRS, 3G, EVDO, mesh, or other networks types.

The methods, programs codes, and instructions described herein and elsewhere may be implemented on or through mobile devices. The mobile devices may include navigation devices, cell phones, mobile phones, mobile personal digital assistants, laptops, palmtops, netbooks, pagers, electronic books readers, music players and the like. These devices may include, apart from other components, a storage medium such as a flash memory, buffer, RAM, ROM and one or more computing devices. The computing devices associated with mobile devices may be enabled to execute program codes, methods, and instructions stored thereon. Alternatively, the mobile devices may be configured to execute instructions in collaboration with other devices. The mobile devices may communicate with base stations interfaced with servers and configured to execute program codes. The mobile devices may communicate on a peer to peer network, mesh network, or other communications network. The program code may be stored on the storage medium associated with the server and executed by a computing device embedded within the server. The base station may include a computing device and a storage medium. The storage device may store program codes and instructions executed by the computing devices associated with the base station.

The computer software, program codes, and/or instructions may be stored and/or accessed on machine readable media that may include: computer components, devices, and recording media that retain digital data used for computing for some interval of time; semiconductor storage known as random access memory (RAM); mass storage typically for more permanent storage, such as optical discs, forms of magnetic storage like hard disks, tapes, drums, cards and other types; processor registers, cache memory, volatile memory, non-volatile memory; optical storage such as CD, DVD; removable media such as flash memory (e.g. USB sticks or keys), floppy disks, magnetic tape, paper tape, punch cards, standalone RAM disks, Zip drives, removable mass storage, off-line, and the like; other computer memory such as dynamic memory, static memory, read/write storage, mutable storage, read only, random access, sequential access, location addressable, file addressable, content addressable, network attached storage, storage area network, bar codes, magnetic ink, and the like.

The methods and systems described herein may transform physical and/or or intangible items from one state to another. The methods and systems described herein may also transform data representing physical and/or intangible items from one state to another, such as from usage data to a normalized usage dataset.

The elements described and depicted herein, including in flow charts and block diagrams throughout the figures, imply logical boundaries between the elements. However, according to software or hardware engineering practices, the depicted elements and the functions thereof may be implemented on machines through computer executable media having a processor capable of executing program instructions stored thereon as a monolithic software structure, as standalone software modules, or as modules that employ external routines, code, services, and so forth, or any combination of these, and all such implementations may be within the scope of the present disclosure. Examples of such machines may include, but may not be limited to, personal digital assistants, laptops, personal computers, mobile phones, other handheld computing devices, medical equipment, wired or wireless communication devices, transducers, chips, calculators, satellites, tablet PCs, electronic books, gadgets, electronic devices, devices having artificial intelligence, computing devices, networking equipment, servers, routers and the like. Furthermore, the elements depicted in the flow chart and block diagrams or any other logical component may be implemented on a machine capable of executing program instructions. Thus, while the foregoing drawings and descriptions set forth functional aspects of the disclosed systems, no particular arrangement of software for implementing these functional aspects should be inferred from these descriptions unless explicitly stated or otherwise clear from the context. Similarly, it will be appreciated that the various steps identified and described above may be varied, and that the order of steps may be adapted to particular applications of the techniques disclosed herein. All such variations and modifications are intended to fall within the scope of this disclosure. As such, the depiction and/or description of an order for various steps should not be understood to require a particular order of execution for those steps, unless required by a particular application, or explicitly stated or otherwise clear from the context.

The methods and/or processes described above, and steps thereof, may be realized in hardware, software or any combination of hardware and software suitable for a particular application. The hardware may include a general purpose computer and/or dedicated computing device or specific computing device or particular aspect or component of a specific computing device. The processes may be realized in one or more microprocessors, microcontrollers, embedded microcontrollers, programmable digital signal processors or other programmable device, along with internal and/or external memory. The processes may also, or instead, be embodied in an application specific integrated circuit, a programmable gate array, programmable array logic, or any other device or combination of devices that may be configured to process electronic signals. It will further be appreciated that one or more of the processes may be realized as a computer executable code capable of being executed on a machine readable medium.

The computer executable code may be created using a structured programming language such as C, an object oriented programming language such as C++, or any other high-level or low-level programming language (including assembly languages, hardware description languages, and database programming languages and technologies) that may be stored, compiled or interpreted to run on one of the above devices, as well as heterogeneous combinations of processors, processor architectures, or combinations of different hardware and software, or any other machine capable of executing program instructions.

Thus, in one aspect, each method described above and combinations thereof may be embodied in computer executable code that, when executing on one or more computing devices, performs the steps thereof. In another aspect, the methods may be embodied in systems that perform the steps thereof, and may be distributed across devices in a number of ways, or all of the functionality may be integrated into a dedicated, standalone device or other hardware. In another aspect, the means for performing the steps associated with the processes described above may include any of the hardware and/or software described above. All such permutations and combinations are intended to fall within the scope of the present disclosure.

All documents referenced herein are hereby incorporated by reference.

What is claimed is:

1. An electrical device comprising:
    a sensor for measuring an electrical property of a first electrical main, wherein the first electrical main provides power to devices in a building;
    a network interface; and
    at least one processor configured to:
        establish a network connection with a smart circuit breaker, wherein the smart circuit breaker provides power to one or more smart-circuit-breaker devices;
        receive a smart-circuit-breaker power monitoring signal via the network connection, wherein the smart-circuit-breaker power monitoring signal indicates an amount of power provided by the smart circuit breaker to the one or more smart-circuit-breaker devices;
        obtain a first-main power monitoring signal using measurements from the sensor;
        identify a smart-circuit-breaker power event in the smart-circuit-breaker power monitoring signal, wherein the smart-circuit-breaker power event corresponds to an event time;
        determine that a first-main power event in the first-main power monitoring signal corresponds to the smart-circuit-breaker power event using the event time;
        determine that the first-main power event corresponds to a first device by processing the first-main power event with a plurality of power models; and
        determine that the first device is connected to the smart circuit breaker using the determination that the first-main power event corresponds to the first device.

2. The electrical device of claim 1, wherein the at least one processor is configured to determine that the first-main power event corresponds to the smart-circuit-breaker power event by comparing the first-main power event to the smart-circuit-breaker power event.

3. The electrical device of claim 2, wherein comparing the first-main power event to the smart-circuit-breaker power event comprises comparing a power change of the first-main power event to a power change of the smart-circuit-breaker power event.

4. The electrical device of claim 2, wherein comparing the first-main power event to the smart-circuit-breaker power event comprises performing one or more of down sampling, translation in time, or amplitude scaling.

5. The electrical device of claim 2, wherein comparing the first-main power event to the smart-circuit-breaker power event comprises:
    obtaining a smart-circuit-breaker portion of the smart-circuit-breaker power monitoring signal corresponding to the smart-circuit-breaker power event;
    obtaining a first-main portion of the first-main power monitoring signal corresponding to the first-main power event; and
    computing a distance between the smart-circuit-breaker portion and the first-main portion.

6. The electrical device of claim 1, wherein the at least one processor is configured to:
    identify a second first-main power event in the first-main power monitoring signal using the event time, wherein the second first-main power event corresponds to a state change of a second device; and
    determine that the first-main power event corresponds to the smart-circuit-breaker power event by comparing the smart-circuit-breaker power event to the first-main power event and by comparing the smart-circuit-breaker power event to the second first-main power event.

7. The electrical device of claim 6, wherein determining that the first-main power event corresponds to the smart-circuit-breaker power event comprises using a wattage model for the first device and a wattage model for the second device.

8. The electrical device of claim 1, wherein the at least one processor is configured to determine that the first-main power event corresponds to the first device by (1) processing the first-main power event with the plurality of power models to generate a score for each power model of the plurality of power models, and (2) selecting a power model corresponding to a highest score.

9. The electrical device of claim 1, wherein the electrical device is an electrical panel.

10. The electrical device of claim 1, wherein the electrical device is an electrical meter.

11. A system for determining that a first device is connected to a smart circuit breaker, the system comprising:
at least one computer comprising at least one processor and at least one memory, the at least one computer configured to:
establish a network connection with the smart circuit breaker, wherein the smart circuit breaker provides power to one or more smart-circuit-breaker devices;
receive a smart-circuit-breaker power monitoring signal via the network connection, wherein the smart-circuit-breaker power monitoring signal indicates an amount of power provided by the smart circuit breaker to the one or more smart-circuit-breaker devices;
obtain a first-main power monitoring signal using measurements from a sensor that measures an electrical property of a first electrical main of a building;
identify a smart-circuit-breaker power event in the smart-circuit-breaker power monitoring signal, wherein the smart-circuit-breaker power event corresponds to a first event time;
determine that a first-main power event in the first-main power monitoring signal corresponds to the smart-circuit-breaker power event using the first event time;
determine that the first-main power event corresponds to the first device by processing the first-main power event with a plurality of power models; and
determine that the first device is connected to the smart circuit breaker using the determination that the first-main power event corresponds to the first device.

12. The system of claim 11, wherein the at least one computer is configured to determine that the first-main power event corresponds to the smart-circuit-breaker power event by comparing the first-main power event to the smart-circuit-breaker power event.

13. The system of claim 12, wherein the at least one computer is configured to compare the first-main power event to the smart-circuit-breaker power event by comparing a power change of the first-main power event to a power change of the smart-circuit-breaker power event.

14. The system of claim 12, wherein the at least one computer is configured to compare the first-main power event to the smart-circuit-breaker power event by:
obtaining a smart-circuit-breaker portion of the smart-circuit-breaker power monitoring signal corresponding to the smart-circuit-breaker power event;
obtaining a first-main portion of the first-main power monitoring signal corresponding to the first-main power event; and
computing a distance between the smart-circuit-breaker portion and the first-main portion.

15. The system of claim 11, wherein the at least one computer is configured to:
identify a plurality of additional smart-circuit-breaker power events in the smart-circuit-breaker power monitoring signal occurring at a plurality of additional event times, wherein each smart circuit breaker power event corresponds to an event time of the plurality of additional event times;
identify a plurality of additional first-main power events in the first-main power monitoring signal using the plurality of additional event times;
process the plurality of additional first-main power events with the plurality of power models to determine a device corresponding to each additional first-main power event;
count a number of times that the first device corresponds to an additional first-main power event of the plurality of additional first-main power events; and
determine that the first device receives power from the smart circuit breaker using the number of times that the first device corresponds to a first-main power event of the plurality of additional first-main power events.

16. The system of claim 11, wherein the at least one computer is configured to:
identify a second first-main power event in the first-main power monitoring signal, wherein the second first-main power event corresponds to a second event time;
determine that the second first-main power event corresponds to a state change of the first device; and
determine that the first device is no longer connected to the smart circuit breaker.

17. The system of claim 11, wherein the at least one computer is configured to determine that the first-main power event corresponds to the first device by (1) processing the first-main power event with the plurality of power models to generate a score for each power model of the plurality of power models, and (2) selecting a power model corresponding to a highest score.

18. A computer-implemented method for determining that a first device is connected to a smart circuit breaker, the computer-implemented method comprising:
establishing a network connection with the smart circuit breaker, wherein the smart circuit breaker provides power to one or more smart-circuit-breaker devices;
receiving a smart-circuit-breaker power monitoring signal via the network connection, wherein the smart-circuit-breaker power monitoring signal indicates an amount of power provided by the smart circuit breaker to the one or more smart-circuit-breaker devices;
obtaining a first-main power monitoring signal using measurements from a sensor that measures an electrical property of a first electrical main of a building;
identifying a smart-circuit-breaker power event in the smart-circuit-breaker power monitoring signal, wherein the smart-circuit-breaker power event corresponds to an event time;
determining that a first-main power event in the first-main power monitoring signal corresponds to the smart-circuit-breaker power event using the event time;
determining that the first-main power event corresponds to the first device by processing the first-main power event with a plurality of power models; and
determining that the first device is connected to the smart circuit breaker using the determination that the first-main power event corresponds to the first device.

19. The computer-implemented method of claim 18, wherein determining that the first device is connected to the smart circuit breaker comprises comparing the first-main power event to the smart-circuit-breaker power event.

20. The computer-implemented method of claim 19, wherein comparing the first-main power event to the smartcircuit-breaker power event comprises comparing a power change of the first-main power event to a power change of the smart-circuit-breaker power event.

21. The computer-implemented method of claim 19, wherein comparing the first-main power event to the smart-circuit-breaker power event comprises:
- obtaining a smart-circuit-breaker portion of the smart-circuit-breaker power monitoring signal corresponding to the smart-circuit-breaker power event;
- obtaining a first-main portion of the first-main power monitoring signal corresponding to the first-main power event; and
- computing a distance between the smart-circuit-breaker portion and the first-main portion.

22. The computer-implemented method of claim 18, comprising retrieving information from a data store indicating that the smart circuit breaker receives power from the first electrical main of the building.

\* \* \* \* \*